United States Patent [19]

Ishida

[11] Patent Number: 5,628,852
[45] Date of Patent: *May 13, 1997

[54] METHOD FOR MANUFACTURING A POLYIMIDE MULTILAYER WIRING SUBSTRATE

[75] Inventor: Hisashi Ishida, Tokyo, Japan

[73] Assignee: NEC Corporation, Tokyo, Japan

[*] Notice: The term of this patent shall not extend beyond the expiration date of Pat. No. 5,426,849.

[21] Appl. No.: 328,950

[22] Filed: Oct. 25, 1994

Related U.S. Application Data

[63] Continuation of Ser. No. 918,594, Jul. 24, 1992, abandoned.

[30] Foreign Application Priority Data

| Jul. 26, 1991 | [JP] | Japan | 3-208793 |
| Oct. 2, 1991 | [JP] | Japan | 3-255517 |

[51] Int. Cl.$^6$ .............. H05K 3/34; H05K 3/36; B32B 31/04; B32B 31/20
[52] U.S. Cl. .............. 156/182; 29/830; 29/831; 29/840; 156/60
[58] Field of Search .............. 156/182, 252, 156/277, 60, 297–298; 29/829–831, 840; 428/901, 473.5; 174/256–259, 261–264

[56] References Cited

U.S. PATENT DOCUMENTS

| 3,958,317 | 5/1976 | Peart et al. ............... 428/901 |
| 4,680,226 | 7/1987 | Takeda ...................... 428/901 |
| 4,736,521 | 4/1988 | Dohya . | |
| 4,774,127 | 9/1988 | Reagan et al. ........... 428/473.5 |
| 4,814,040 | 3/1989 | Ozawa ...................... 156/902 |
| 5,109,320 | 4/1992 | Bourdelaise et al. ..... 428/901 |
| 5,152,868 | 10/1992 | Schiltz et al. ........... 428/901 |
| 5,196,371 | 3/1993 | Kulesza et al. .......... 29/831 |
| 5,337,466 | 8/1994 | Ishida . | |
| 5,426,849 | 6/1995 | Kinbara et al. ......... 156/182 X |

FOREIGN PATENT DOCUMENTS

| 481472 | 4/1992 | European Pat. Off. ........ 29/829 |
| 1940039 | 2/1971 | Germany ........................ 29/829 |
| 54-21165 | 2/1979 | Japan ............................ 29/829 |
| 1-313998 | 12/1989 | Japan ............................ 428/901 |
| 2-12990 | 1/1990 | Japan ............................ 428/901 |
| 2-63190 | 3/1990 | Japan ............................ 29/829 |
| 2-290095 | 11/1990 | Japan ............................ 29/829 |
| 2-299289 | 12/1990 | Japan ............................ 29/829 |
| 3-83397 | 4/1991 | Japan ............................ 29/829 |
| 3-204994 | 9/1991 | Japan ............................ 29/829 |
| 4-64280 | 2/1992 | Japan ............................ 29/829 |
| 4-162589 | 6/1992 | Japan . | |

OTHER PUBLICATIONS

Herman N. K. "Multilayer Laminates" IBM Technical Disclosure Bulletin vol. 11, No. 8, Jan. 1969.

*Primary Examiner*—Adrienne C. Johnstone
*Attorney, Agent, or Firm*—Foley & Lardner

[57] ABSTRACT

A polyimide multilayer wiring substrate that comprises a plurality of wiring layer blocks, each of which including a plurality of polyimide wiring layers, which are electrically connected and formed into a single body by means of an anisotropic conductive film that is inserted between adjacent blocks, the multiple wiring substrate being manufactured by inserting said anisotropic conductive film between adjacent blocks and compressing and heating the blocks and layer of film so as to form them into a single body. This process of inserting, compressing and heating is repeated N times to provide a layered structure comprising N pieces of wiring layer blocks.

8 Claims, 21 Drawing Sheets

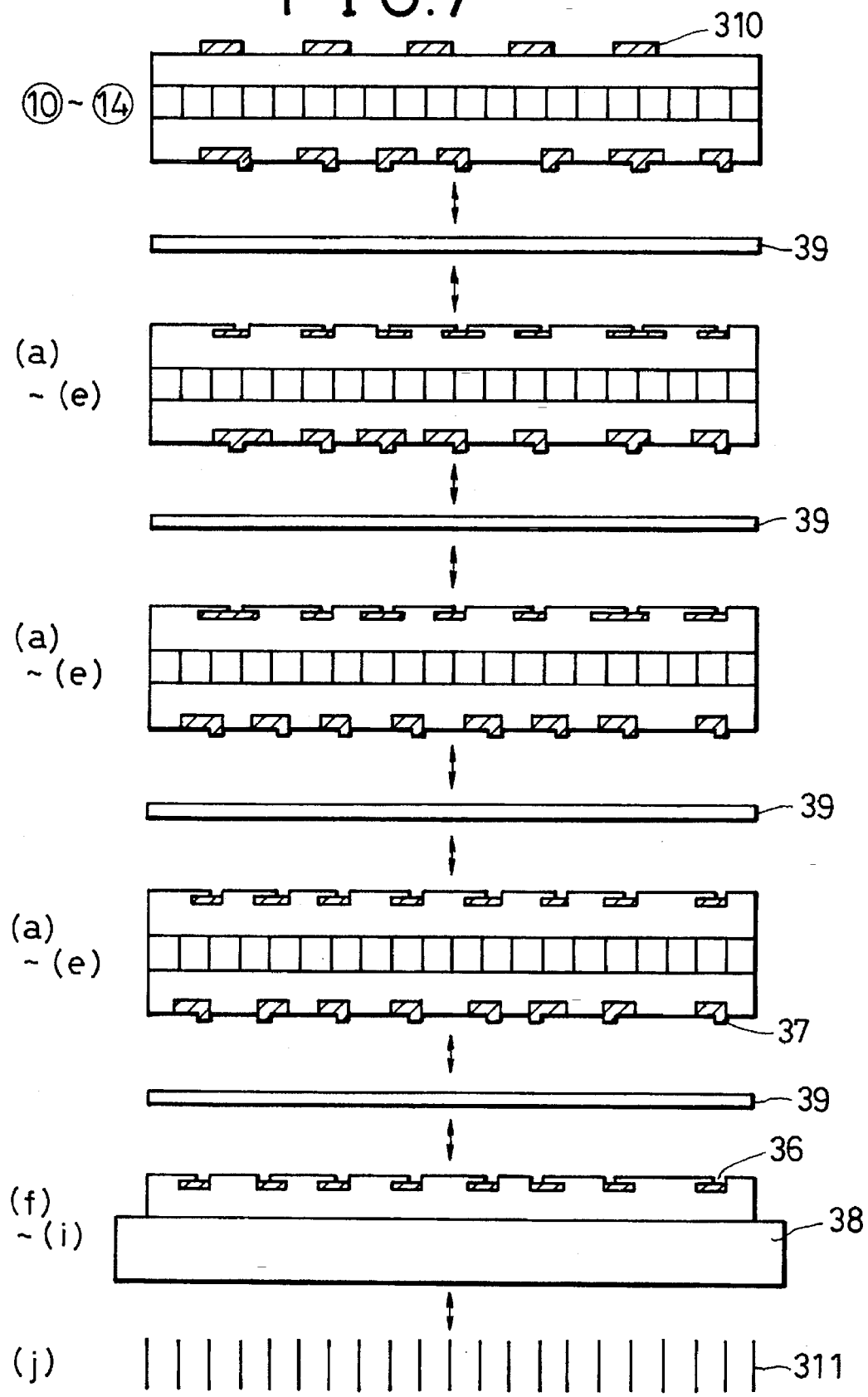

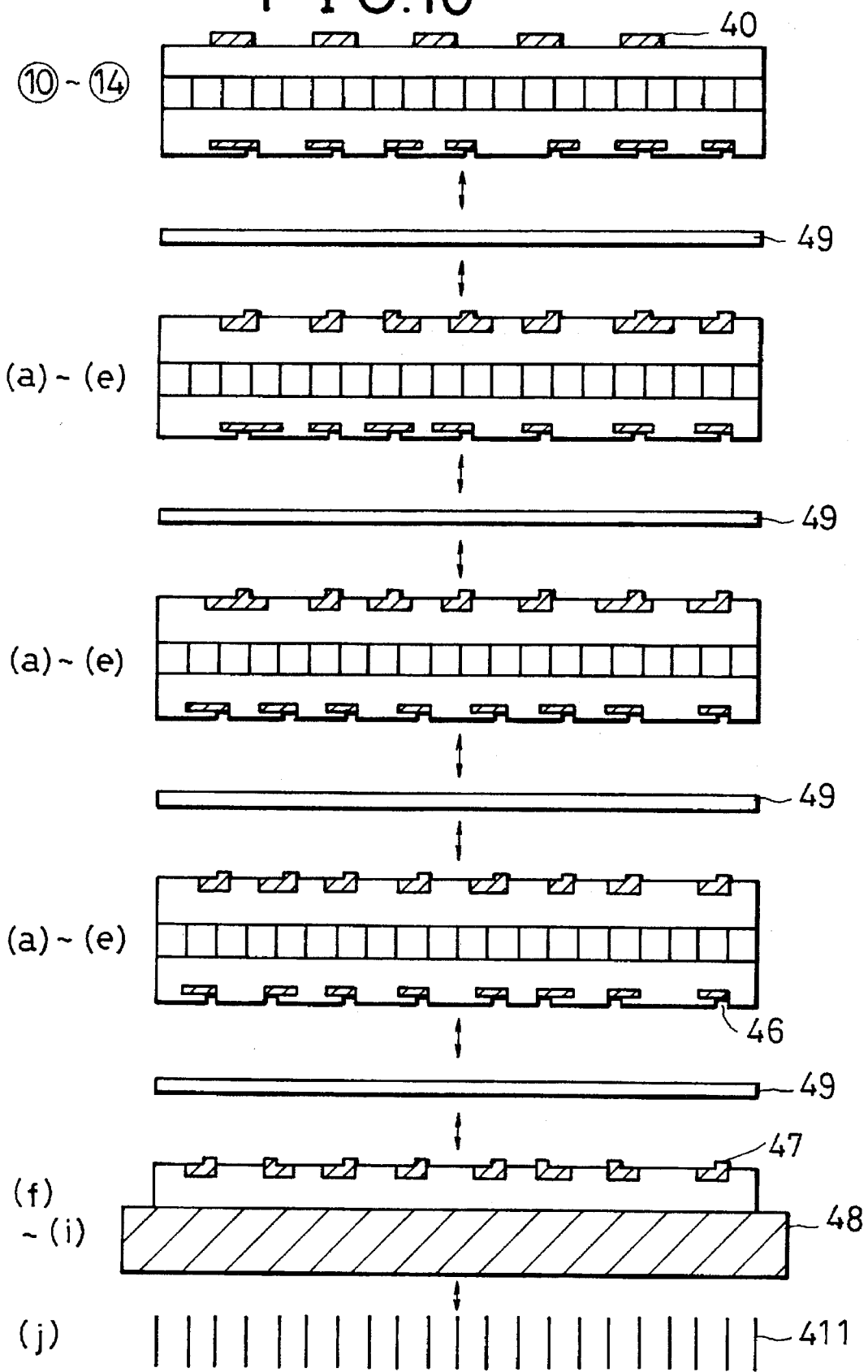

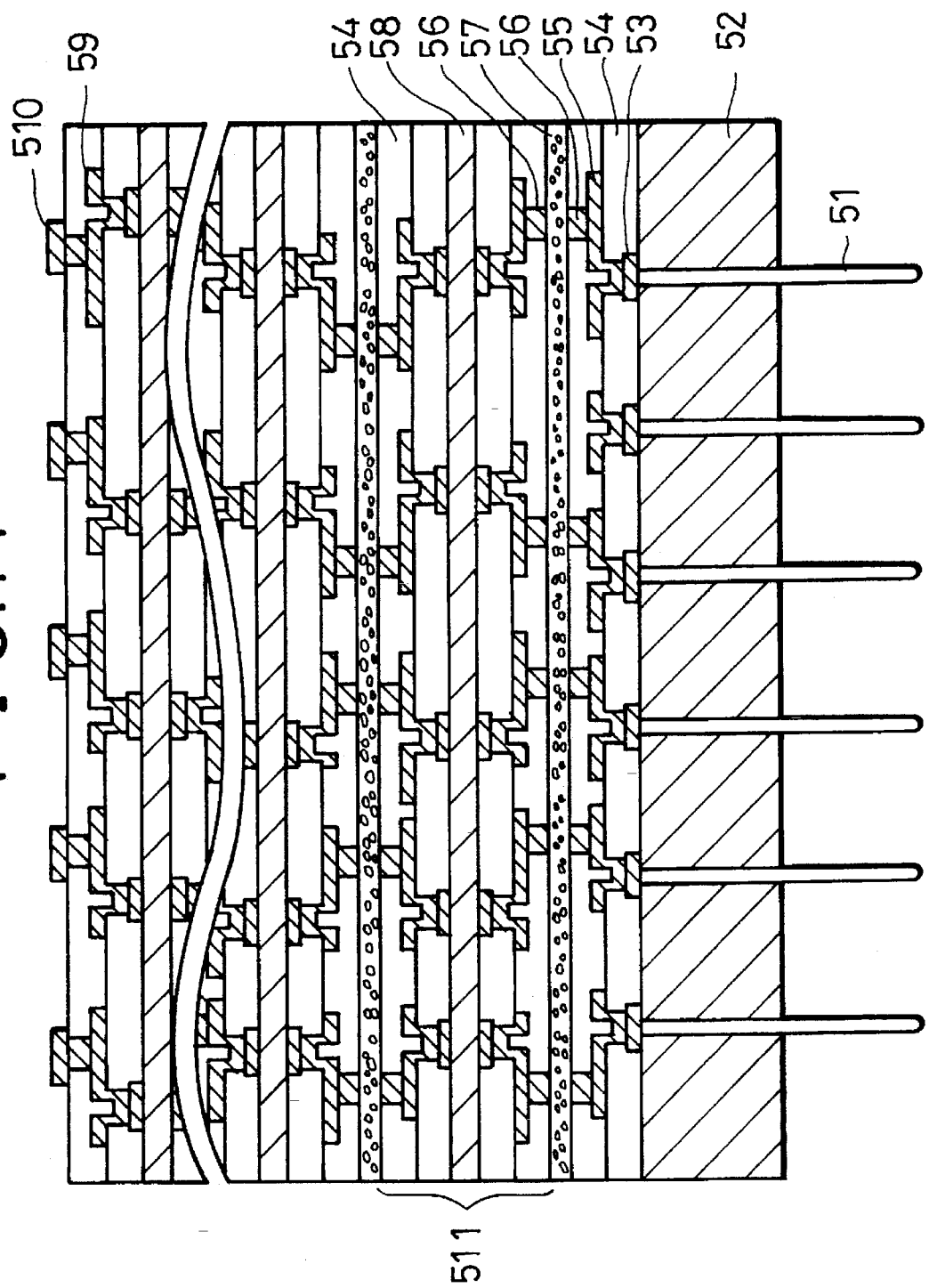

F I G. 17(e)
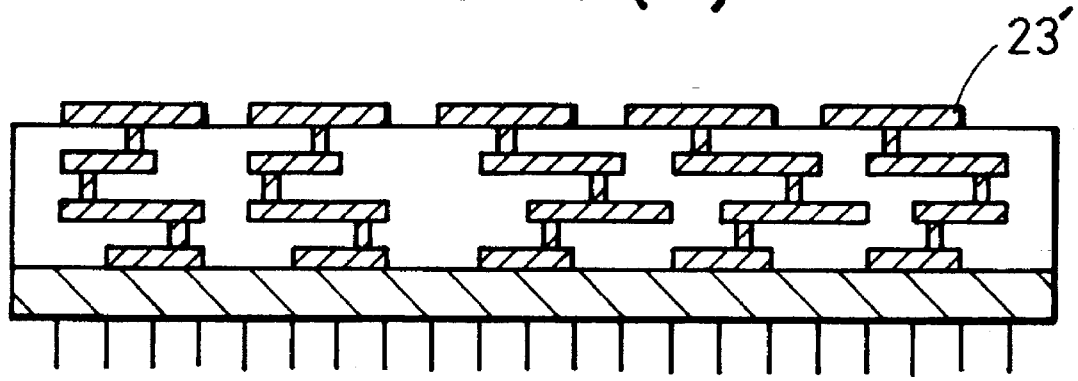
F I G. 17(f)
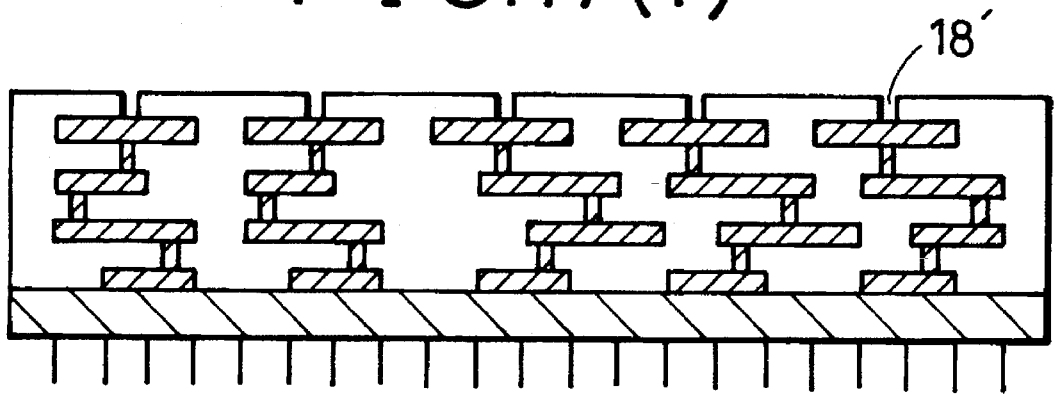
F I G. 17(g)
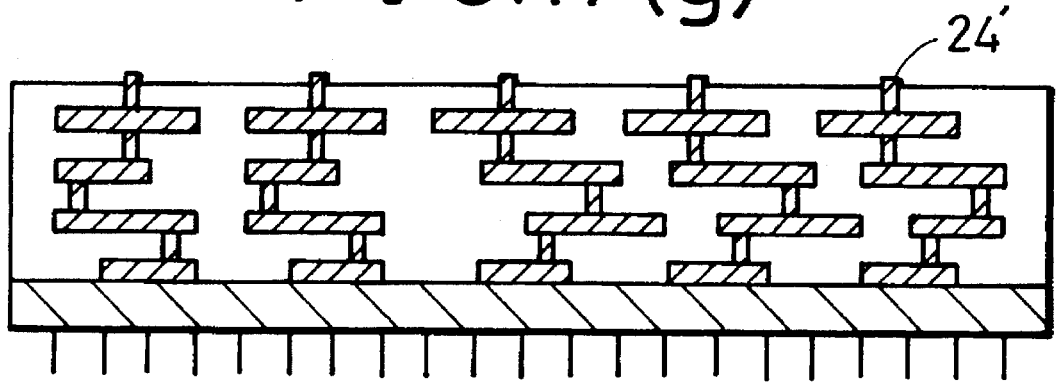

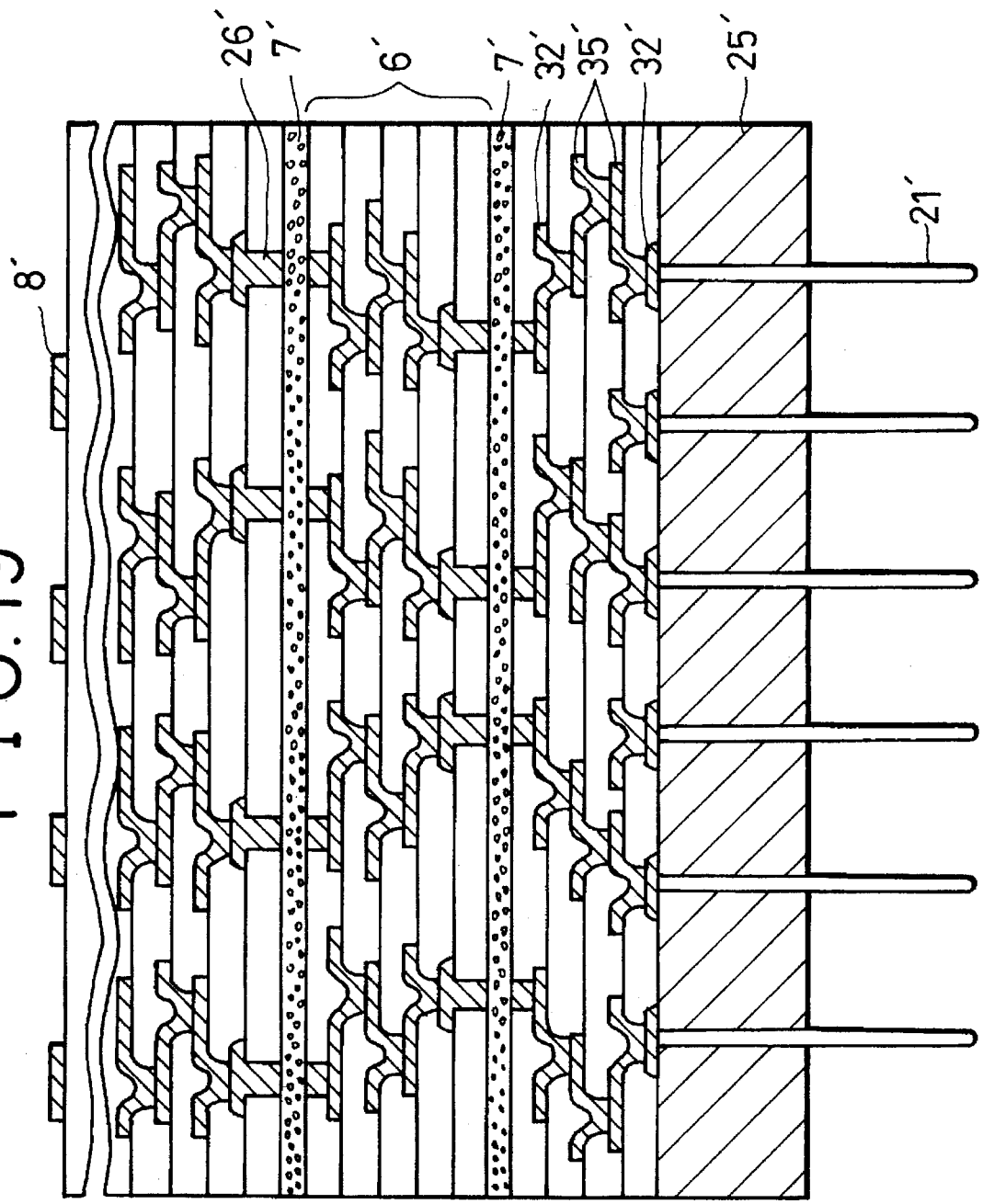

METHOD FOR MANUFACTURING A POLYIMIDE MULTILAYER WIRING SUBSTRATE

This application is a continuation of application Ser. No. 07/918,594, filed Jul. 24, 1992, now abandoned.

BACKGROUND OF THE INVENTION

1. Field of the Invention

The present invention relates generally to the structure of a polyimide multilayer wiring substrate having multiple wiring layers, wherein polyimide resin is employed as interlaminar insulation, and a manufacturing method of said substrate and, more particularly to a structure of polyimide resin layers and a method for laminating said layers.

2. Description of the Related Art

The use of a multilayer printed wiring substrate as a wiring substrate for carrying LSI chips is well known. The multilayer printed wiring substrate comprises copper-plated layered sheets as core materials and prepreg as adhesives for the core materials, the core materials and prepreg being alternately laminated integrally with each other by application of heat pressing. After the core materials and prepreg are integrally laminated, through-holes are drilled through the substrate by means of a drill and the inner walls of the through-holes are plated with copper to effect electrical connections between the laminated sheets.

In recent years, a polyimide-ceramic multilayer wiring substrate in which polyimide resin is applied to a ceramic substrate to effect interlaminar insulation has been brought into use as a wiring substrate for use in large computers. This type of substrate requires wiring of greater density than that of the multilayer printed wiring substrate. Said polyimide-ceramic multilayer wiring substrate is produced by a method comprising a series of polyimide resin insulation layer formation steps, in which polyimide precursor varnish is applied to a ceramic substrate and dried to form a coating film in which viaholes are formed, and a wiring layer formation steps, in which photolithography, vacuum vapor deposition and plating methods are utilized, these steps being repeated to form polyimide multiple wiring layers.

Apart from the aforementioned method for forming a polyimide-ceramic multilayer wiring substrate, there is a method for forming a multilayer wiring substrate by forming a wiring pattern on a polyimide sheet, positioning said sheet on a ceramic substrate, and successively performing the aforementioned steps under pressure to form laminated sheets. By this method, a signal layer is formed one sheet at a time, thereby enabling the selection and lamination of sheets free from defects, with the result that the manufacturing yield can be raised.

In the aforesaid multilayer printed wiring substrate, electrical connection between laminated sheets is established through a through-hole formed by means of a drill; however, it is impossible to form a through-hole having a very small diameter, and the number of connections that can be provided by the through-holes is therefore limited. Since one connection between laminated sheets requires one through-hole, as the number of laminations increases, the capacity for accommodating signal wirings decreases, thereby making it difficult to form a multilayer printed wiring substrate of high wiring density.

A polyimide-ceramic multilayer wiring substrate which has recently been developed to remedy the drawback of the conventional multilayer printed wiring substrate requires repeated processes comprising application of precursor varnish to a ceramic substrate, drying said varnish, formation of viaholes, and curing the substrate, these processes being repeated as many times as the number of laminations of polyimide insulation layers, resulting in a very lengthy lamination process of the multilayers. Since the formation process of the polyimide insulation layers is performed repeatedly, the polyimide resins of lower layers of the multiple wiring layers are repeatedly subjected to the heat stress of the curing process, resulting in the degradation of the polyimide resins. Further, the polyimide multiple wiring layers are laminated in succession, layer after layer, thereby making it difficult to improve manufacturing yield.

If the lamination is carried out sheet after sheet, a process which has been developed to improve the manufacturing yield, there are also the drawbacks that since the layers are laminated layer after layer under pressure, as the number of layers increases, heat stress is imparted to the polyimide resin of the lower layers and causes the degradation of the lower layers, and in addition, the manufacturing process is time-consuming.

SUMMARY OF THE INVENTION

Accordingly, the present invention has been made to overcome the deficiencies and disadvantages of the prior art.

An object of the invention is to provide a polyimide multilayer wiring substrate having large numbers of layers, high-density wiring, and high capacity for accommodating signal wiring.

Another object of the invention is to eliminate the need for repeated curing, thereby reducing the manufacturing period of wiring substrates and preventing the degradation of polyimide resins due to repeated curing.

A further object of the invention is to make it possible to inspect wiring layers, block after block, to improve the manufacturing yield ratio.

Yet another object of the invention is to prevent the occurrence of cracks and fractures in the polyimide resins and ceramic boards.

According to the invention, a polyimide multilayer wiring substrate is provided, in which a plurality of polyimide wiring layers are formed into wiring layer blocks, which are classified into two groups, first wiring layer blocks and second ones. By interposing an anisotropic conductive film (a conductive film having therein metallic particles) between the surface of polyimide of the first block and that of the second block, N pieces of the wiring blocks are formed into a one-piece body. In a multilayer wiring substrate having polyimide multiple wiring layers formed on an insulating substrate, said polyimide multiple wiring layers are formed into a layered structure by stacking a plurality of blocks on one another, each of said blocks having polyimide wiring layers formed on both sides of an insulating board including therein a conductive layer, in which electrical connection and bonding between the adjacent blocks is established through an anisotropic conductive film interposed between the said blocks.

Further, the present invention provides a method for manufacturing a polyimide multilayer wiring substrate in which an anisotropic conductive film is interposed between two wiring layer blocks which are compressed and heated to form a one-piece body. This process of interposing, compressing and heating is repeated N times to produce a polyimide multilayer wiring substrate with a layered structure comprising N pieces of wiring layers. The method for manufacturing a polyimide multilayer wiring substrate includes the steps of:

(1) forming a polyimide double-wiring layer on both sides of a ceramic board or a hard organic resin board, which includes within the board a conductive layer, in such a manner that metal bumps are formed on the surface of the polyimide double-wiring layer which are in electrical contact with the wiring layer in said polyimide wiring layers through viaholes, (2) forming polyimide double-wiring layers on a ceramic substrate or a hard organic resin substrate, on the surface of which are formed metal bumps electrically connected to the wiring layers through viaholes in the same manner as described in step (1), (3) superposing the ceramic board or hard organic resin board having the polyimide double-wiring layers on both sides thereof as formed in step (1) on a ceramic substrate or hard organic resin substrate having the polyimide wiring layer formed in step (2) with an anisotropic conductive film interposed between these boards after said boards and said film have been vertically aligned in order to bond said wiring layer formed in step (1) to said wiring layer formed in step (2) by the adhesive force of said conductive film under conditions of pressure and heat such that the metal bumps in each board press against the conductive film of the board opposite and crush the conductive particles in the conductive film so as to establish electrical connection between the polyimide double-wiring layers formed in steps (1) and (2), (4) superposing the metal bumps formed on the surface of polyimide double-wiring layers on the ceramic board or hard organic resin board including therein conductive layers laminated in step (3), on the metal bumps, formed on the surface of polyimide double-wiring layers on the rear surface of another ceramic board or hard organic board including therein conductive layers laminated by the same method as that of step (1), by the same method as that of step (3), (5) repeating step (4) a number of times to form multiple wiring layers comprising ceramic substrates or hard organic resin substrates having polyimide wiring layers thereon and ceramic boards or hard organic resin boards having conductive layers therein.

Still further, the present invention provides another method for manufacturing a polyimide multilayer wiring substrate. The method comprises the steps of:

a) forming a plurality of first wiring layer blocks, each of the first wiring layer blocks being formed by forming a layered structure of conductive wiring layers and polyimide layers on top and bottom surfaces of one of a ceramic board and a hard organic resin board having an internal conductive layer, each of the polyimide layers of the first wiring layer blocks being formed between two successive layers of the conductive wiring layers of the first wiring layer blocks, and by forming metal bumps in electrical contact with the conductive wiring layers on a top surface of each of the first wiring layer blocks and forming a first plurality of viaholes in an outermost polyimide layer on a bottom surface of each of the wiring layer blocks, each of the first plurality of viaholes having a metal part at its bottom, the metal part being in electrical contact with the conductive wiring layers in the interior of the each of the first wiring layer blocks, the conductive wiring layers of the first wiring layer blocks being connected between the polyimide layers of the first wiring layer blocks through a second plurality of viaholes in the first wiring layer blocks;

b) forming a second wiring layer block, by forming a layered structure of conductive wiring layers and polyimide layers on one of a ceramic board and a hard organic resin board, each of the polyimide layers of the second wiring layer block being formed between two successive layers of the conductive wiring layers of the second wiring layer block, and forming a third plurality of viaholes in the polyimide layers through which the conductive wiring layers are electrically connected, and by forming metal bumps in electrical contact with the conductive wiring layers in the second wiring layer block on a top surface of the second wiring layer block, the conductive wiring layers of the second wiring layer block being connected between the polyimide layers of the second wiring layer block through a fourth plurality of viaholes in the second wiring layer block;

c) interposing a first anisotropically conductive film, having conductive particles therein, between a bottom surface of one of the first wiring layer blocks and the top surface of the second wiring layer block;

d) superposing the bottom surface of the one of the first wiring layer blocks onto the top surface of the second wiring layer block with the first anisotropically conductive film therebetween, the viaholes on the bottom surface of the one of the first wiring layer blocks being aligned with the metal bumps on the top surface of the second wiring layer block;

e) bonding and electrically connecting the one of the first wiring layer blocks and the second wiring layer block by subjecting the one of the first wiring layer blocks and the second wiring layer block to pressure and heat, the bonding being achieved by adhesive force of the first anisotropically conductive film under conditions of pressure and heating, the electrical connection being formed as the metal parts at the bottom of the viaholes of the one of the first wiring layer blocks and the metal bumps of the second wiring layer block press against the first anisotropically conductive film, crushing the conductive particles in the anisotropically conductive film only between the metal parts and the metal bumps;

f) interposing a second anisotropically conductive film, having conductive particles therein, between a bottom surface of another of the first wiring layer blocks and a top surface of the one of the first wiring layer blocks;

g) superposing the bottom surface of the another of the first wiring layer blocks onto the top surface of the one of the first wiring layer blocks with the second anisotropically conductive film therebetween, viaholes on the bottom surface of the another of the first wiring layer blocks being aligned with the metal bumps on the top surface of the one of the first wiring layer blocks;

h) bonding and electrically connecting the one of the first wiring layer blocks and the another of the first wiring layer blocks in a manner as recited in the step e;

i) repeating the steps f, g and h a number of times to form multiple wiring layer blocks stacked on the one of the ceramic and hard organic resin board; and j) forming electrode pads for connecting a large scale integrated (LSI) circuit on a top surface of an uppermost one of the plurality of first wiring layer blocks.

The present invention also provides still another method for manufacturing a polyimide multilayer wiring substrate. The method comprising the steps of:

a) forming a plurality of first wiring layer blocks, each of the first wiring layer blocks being formed by forming a layered structure of conductive wiring layers and polyimide layers on top and bottom surfaces of one of a ceramic board and a hard organic resin board having an internal conductive layer, each of the polyimide layers of the first wiring layer blocks being formed between two successive layers of the conductive wiring layers of the first wiring layer block, and by forming metal bumps in electrical contact with the conductive wiring layers on a bottom surface of each of the first wiring layer blocks and by forming a first plurality of viaholes in an outer polyimide layer on a top surface of each of the wiring layer blocks, each of the first plurality of viaholes having a metal part at its bottom, the metal part being in electrical contact with the conductive wiring layers in the interior of the each of the first wiring layer blocks, the conductive wiring layers of the first wiring layer blocks being connected between the polyimide layers of the first wiring layer blocks through a second plurality of viaholes in the first wiring layer blocks;

b) forming a second wiring layer block, by forming a layered structure of conductive wiring layers and polyimide layers on one of a ceramic board and a hard organic resin board, each of the polyimide layers of the second wiring layer block being formed between two successive layers of the conductive wiring layers of the second wiring layer block, forming viaholes in the polyimide layers through which the conductive wiring layers are electrically connected, and by forming additional viaholes in an outer polyimide layer on a top surface of the second wiring layer block, each of the additional viaholes having a metal part at its bottom, the metal part being in electrical contact with the conductive wiring layers in the interior of the second wiring layer block;

c) interposing a first anisotropically conductive film, having conductive particles therein, between the bottom surface of one of the first wiring layer blocks and the top surface of the second wiring layer block;

d) superposing the bottom surface of the one of the first wiring layer blocks onto the top surface of the second wiring layer block with the first anisotropically conductive film therebetween, the metal bumps on the bottom surface of the one of the first wiring layer blocks being aligned with the additional viaholes of the second wiring layer block;

e) bonding and electrically connecting the one of the first wiring layer blocks and the second wiring layer block by subjecting the one of the first wiring layer blocks and the second wiring layer block to pressure and heat, the bonding being achieved by adhesive force of the first anisotropically conductive film under conditions of pressure and heating, the electrical connection being formed as the metal bumps on the bottom surface of the one of the first wiring layer blocks and the metal parts at the bottom of the additional viaholes of the second wiring layer block press against the first anisotropically conductive film, crushing the conductive particles in the first anisotropically conductive film only between the metal parts and the metal bumps;

f) interposing a second anisotropically conductive film, having conductive particles therein, between a bottom surface of another of the first wiring layer blocks and a top surface of the one of the first wiring layer blocks;

g) superposing the bottom surface of the another of the first wiring layer blocks onto the top surface of the one of the first wiring layer blocks with the second anisotropically conductive film therebetween, metal bumps on a bottom surface of the another of the first wiring layer blocks being aligned with the viaholes on the top surface of the one of the first wiring layer blocks;

h) bonding and electrically connecting the one of the first wiring layer blocks and the another of the first wiring layer blocks in a manner as recited in the step e;

i) repeating the steps f, g and h a number of times to form multiple wiring layer blocks stacked on the one of the ceramic and hard organic resin board; and j) forming electrode pads for connecting a large scale integrated (LSI) circuit on a top surface of an uppermost one of the plurality of first wiring layer blocks.

The above and other objects, features, and advantages of the present invention will become apparent from the following description referring to the accompanying drawings which illustrate an example of a preferred embodiment of the present invention.

BRIEF DESCRIPTION OF THE DRAWINGS

FIGS. 5a–5e, 6f–6i, and 7 illustrate the succession of steps of a manufacturing method of a second embodiment of the invention.

FIGS. 8a–8e, 9f–9i, and 10 illustrate the succession of steps of a manufacturing method of a third embodiment of the invention.

FIG. 11 is a sectional view of the second embodiment of the invention and illustrates the structure of a polyimide multilayer wiring substrate.

FIGS. 16a–16d, 17a–17g, and 18a–18c illustrate the succession of steps of a fifth embodiment of a manufacturing method of the substrate of the invention.

FIG. 19 is a sectional view of the fifth embodiment of the substrate of the invention.

DETAILED DESCRIPTION OF THE PREFERRED EMBODIMENTS

The present invention will now be described with reference to the attached drawings.

Figure 1:
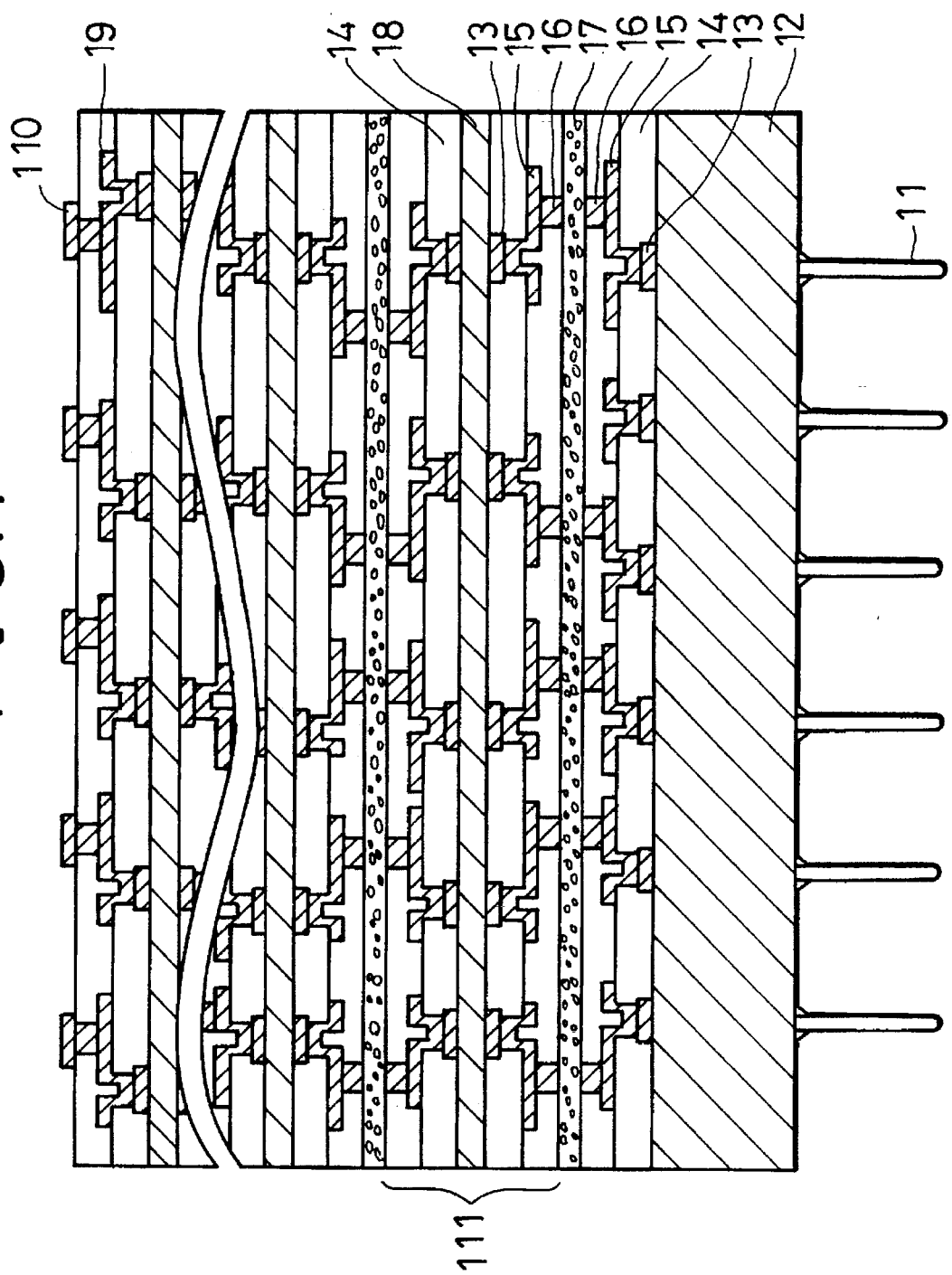
FIG. 1 is a sectional view of a first embodiment of the invention and illustrates the structure of a polyimide multilayer wiring substrate.
Figure 2A:
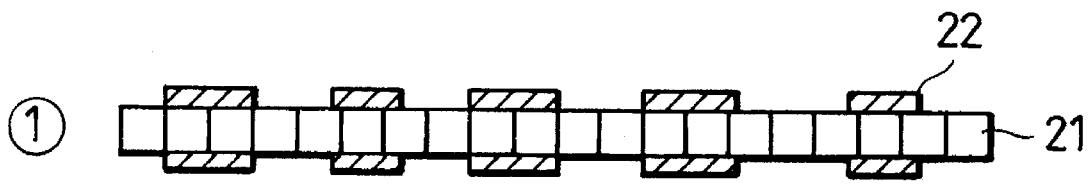
FIGS. 2a–2d, 3e–3h, and 4 illustrate the succession of steps of a manufacturing method of the first embodiment of the invention.
Figure 2B:
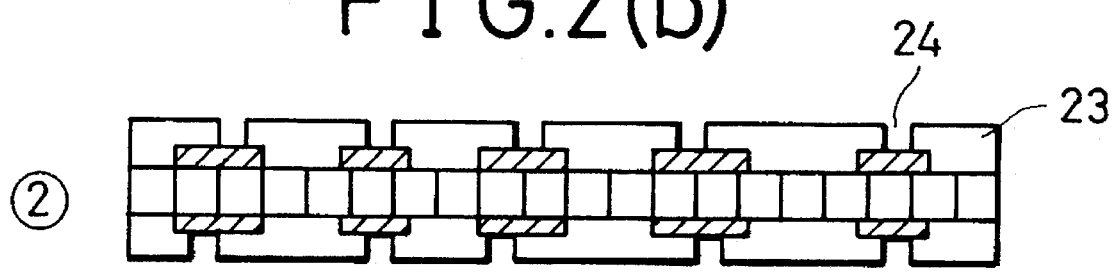
Figure 2C:
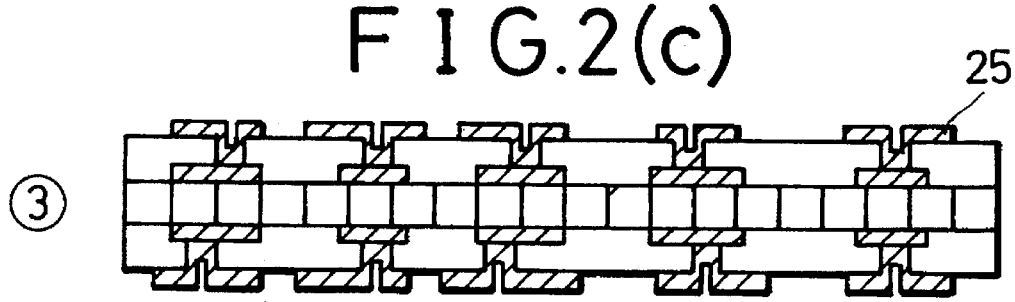
Figure 2D:
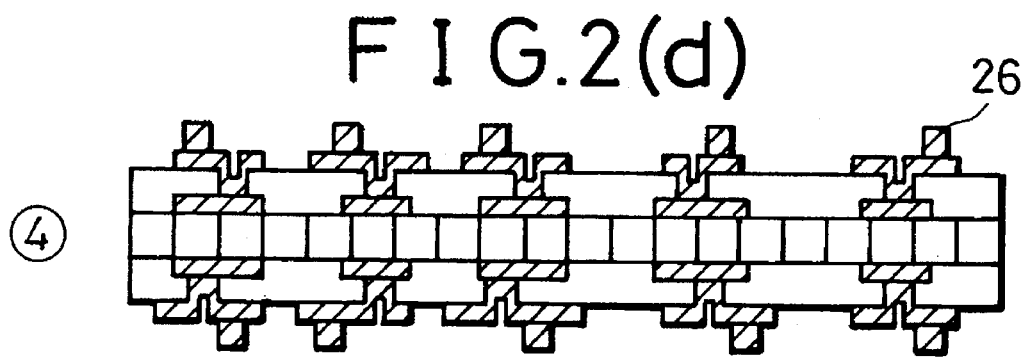
Figure 3E:
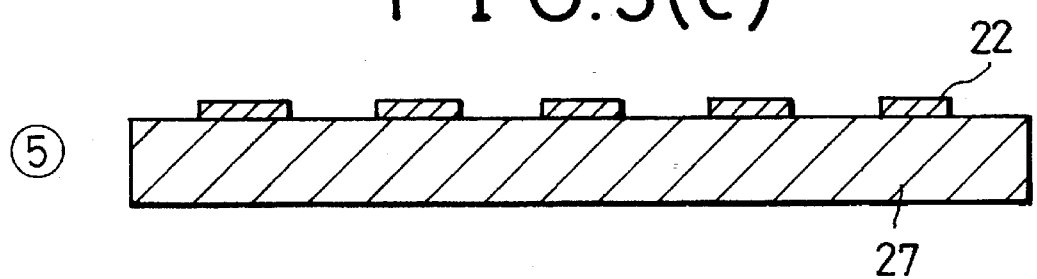
Figure 3F:
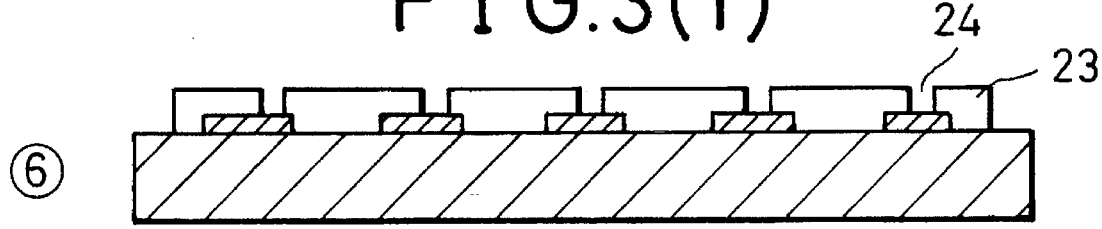
Figure 3G:
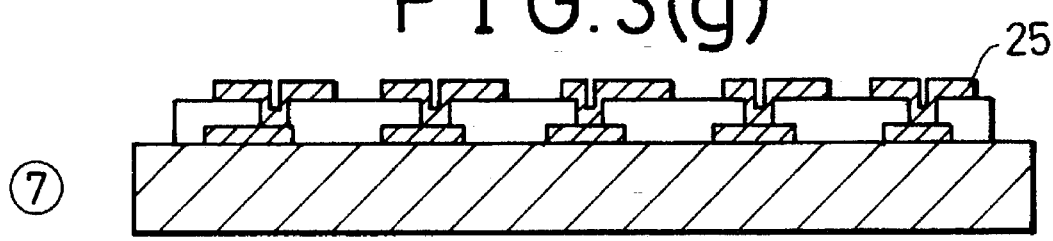
Figure 3H:
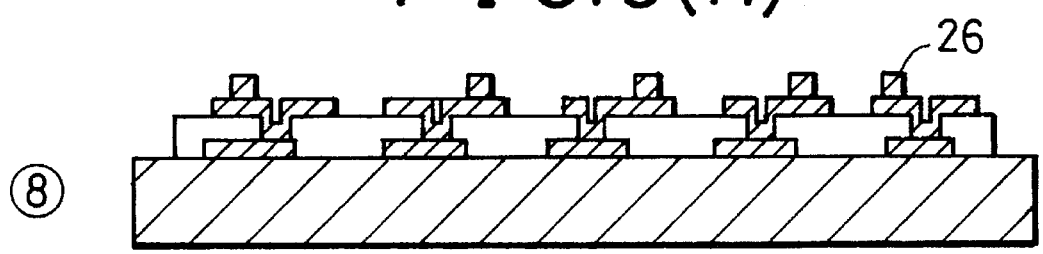

FIG. 1 is a sectional view showing a polyimide multilayer wiring substrate of the present invention. Ceramic base substrate 12 of the present embodiment is a co-fired alumina ceramic substrate having input/output pin 11 attached to the back side thereof and a molybdenum metal internal wiring layer. The specifications of the polyimide multiple wiring layers are as follows. Signal wiring 15 consists of gold-plated wires 25 μm wide and 7 μm thick. A signal wiring unit is composed of two wirings in the X direction and Y direction being interposed between two ground wiring layers 13 disposed on the upper and lower sides thereof, to adjust impedance and reduce crosstalk noise in the wiring. The polyimide resins 14 used are, for example, in the case of photo-unsensitive resins, PIQ of Hitachi Chemical Co., Ltd., PYRALIN of Dupont, SEMICOFINE of Toray Industries, Inc., and in the case of photo-sensitive resins, PL-1200 of Hitachi, PI-2702D of Dupont, PHOTONEECE of Toray and PIMEL of Asahi Chemical Industry Co., Ltd., with the film thickness between wiring layers being 20 μm. The signal wiring layers are provided in eight tiers. The wiring substrate is basically composed of a ground electrode layer and a signal wiring layer disposed on both the front and rear sides of the ceramic board which includes internal conductor layers, thus forming a block 111. The wiring substrate of the present embodiment is composed of four blocks which are interconnected following electrical inspection to eliminate defective blocks. Electrical interconnection between each block is established by means of the pressure applied by oppositely positioned nickel-gold bumps 16 formed by applying gold plating onto nickel plating against the surface of an interposed anisotropic conductive film 17 having conductive particles present within the film 17. The nickel-.gold bumps are formed in the range of, for instance, 25–300 μm square and 10–50 μm thick. The anisotropic conductive film is 20–30 μm thick and contains conductive particles of 5–25 μm in diameter with a density of 5–20% by volume. The anisotropic conductive film is made up of, for example, SUMIZAC 1003 of Sumitomo Bakelite Co., Ltd. On the top layer of the polyimide multilayer wiring substrate thus formed, connection pads 110 to be used for soldering on an LSI chip are formed by applying copper plating.

Figure 4:
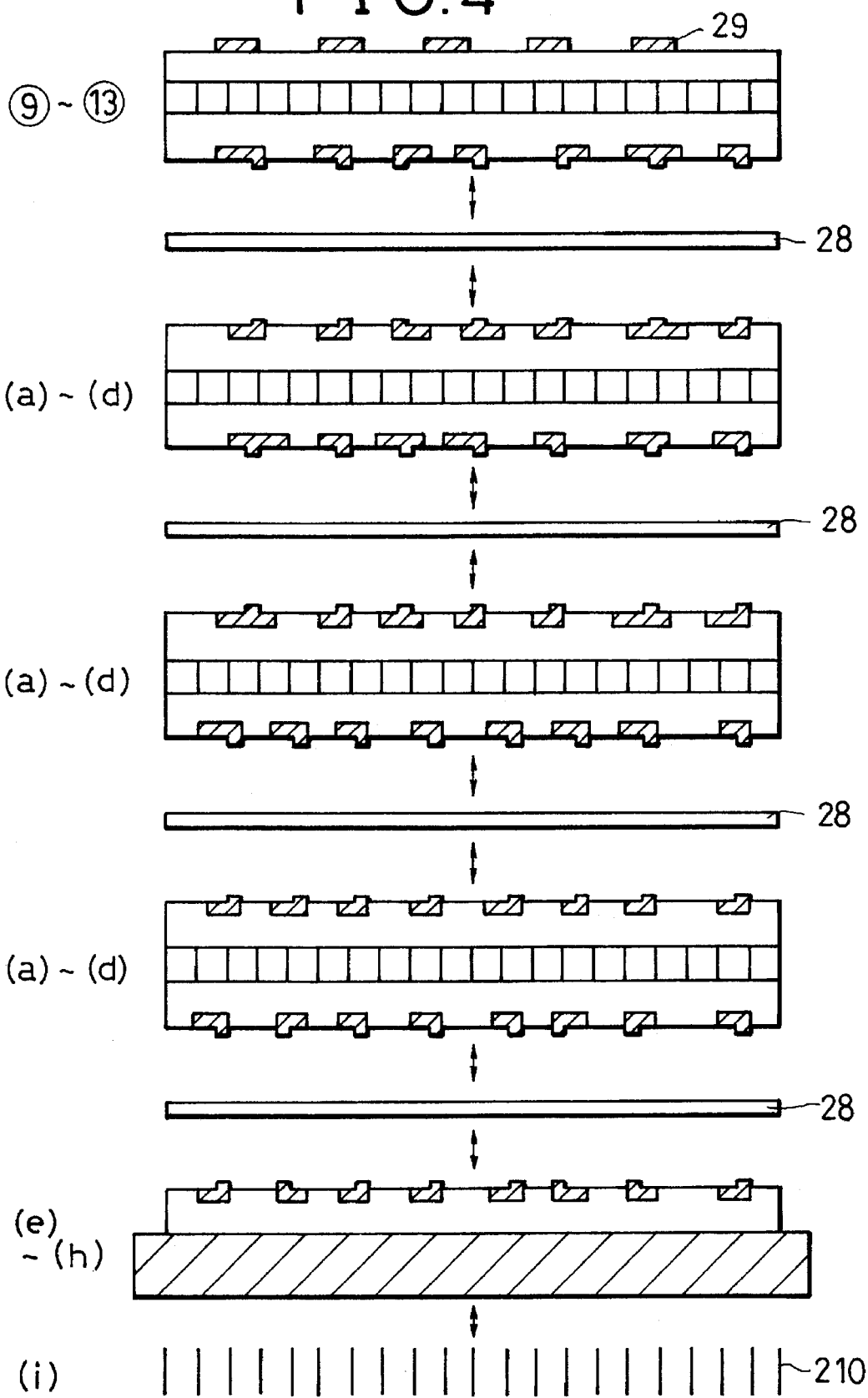
Figure 5A:
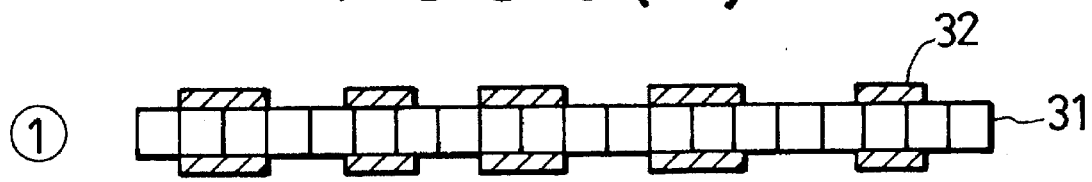
Figure 5B:
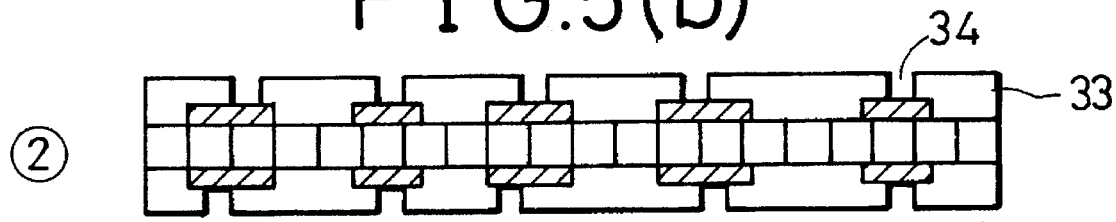
Figure 5C:
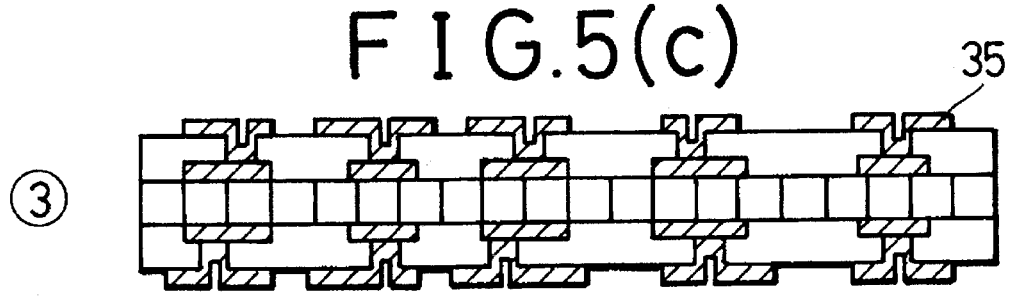
Figure 5D:
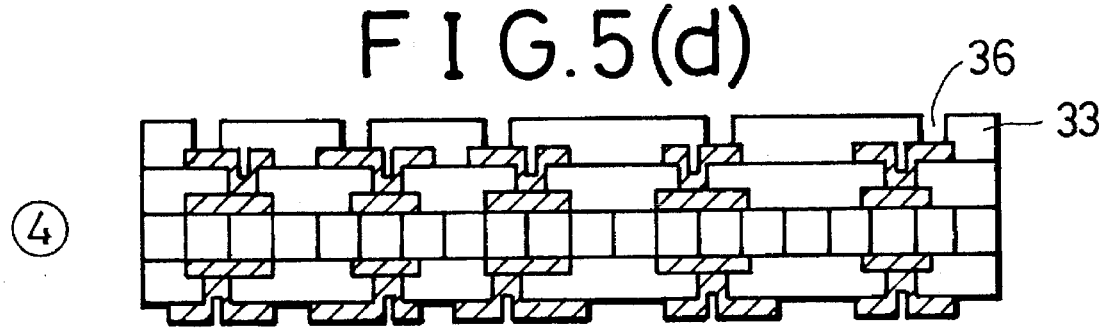
Figure 5E:
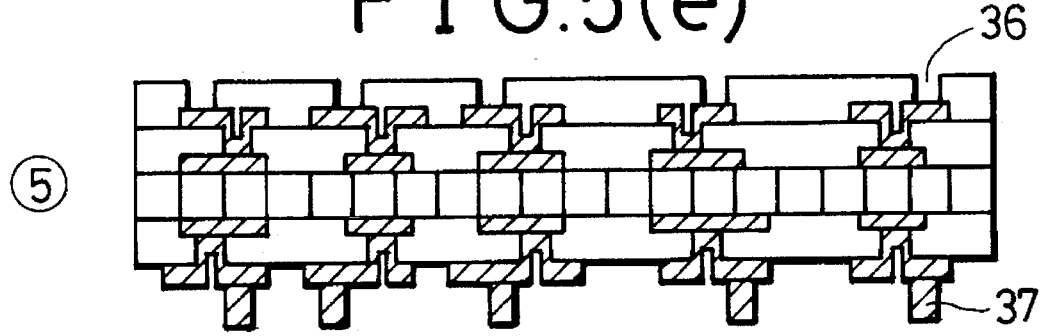
Figure 6F:
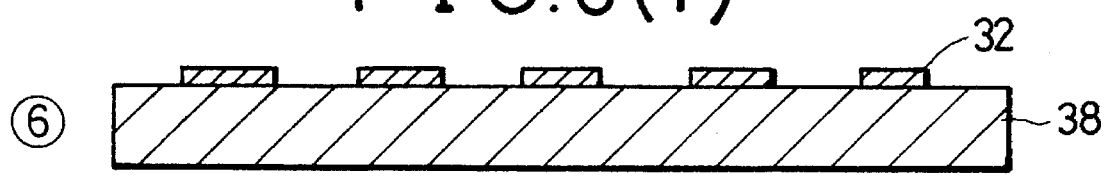
Figure 6G:
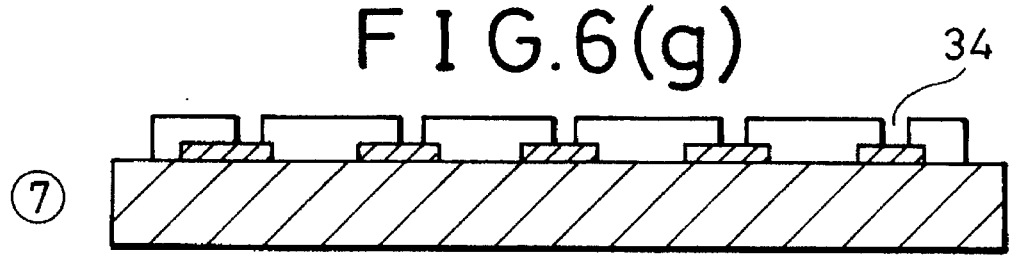
Figure 6H:
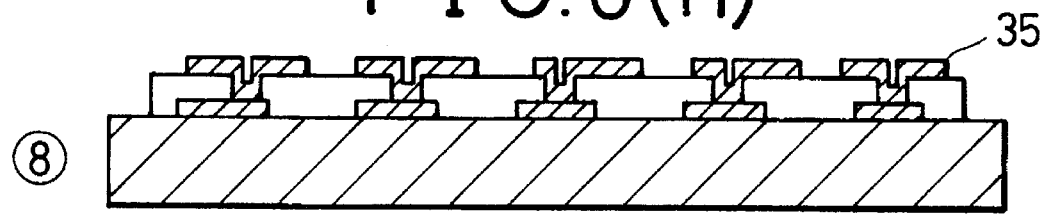
Figure 6I:
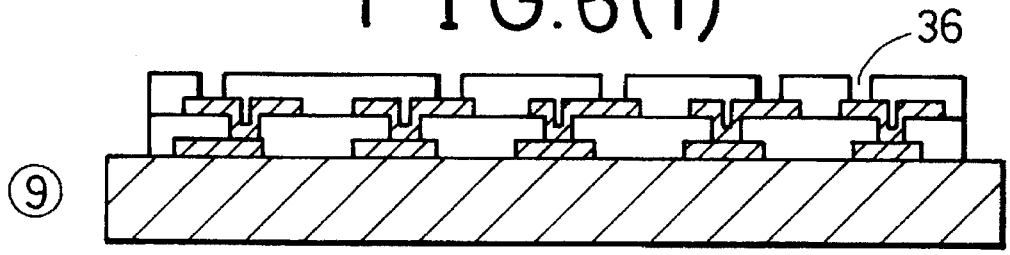
Figure 8A:
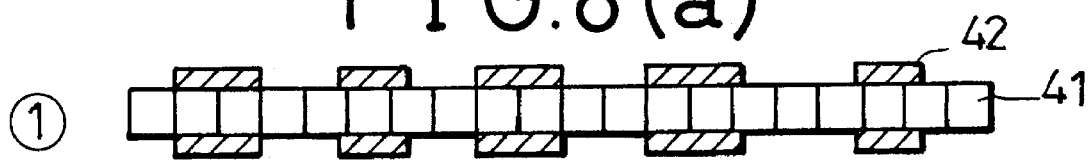
Figure 8B:
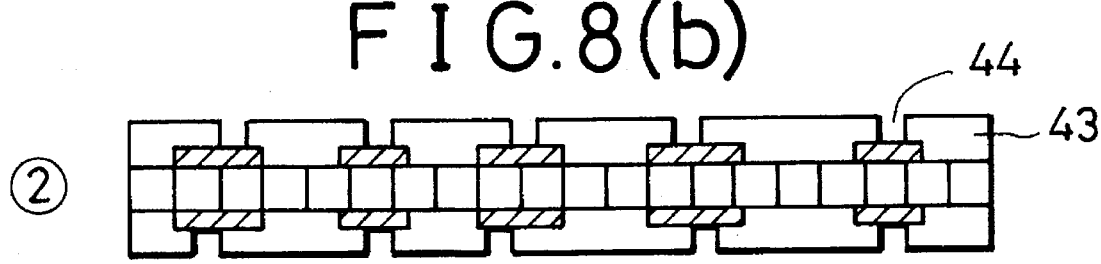
Figure 8C:
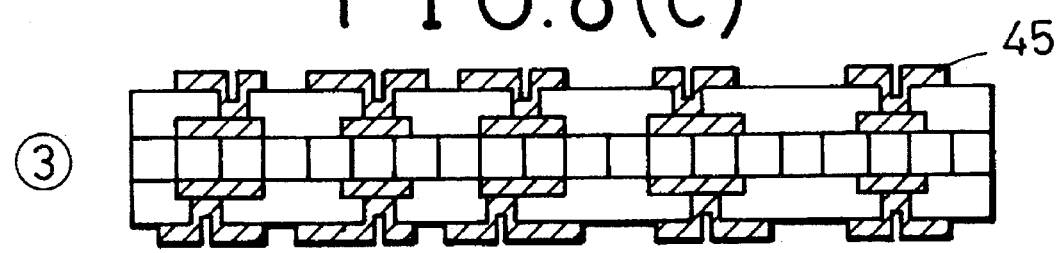
Figure 8D:
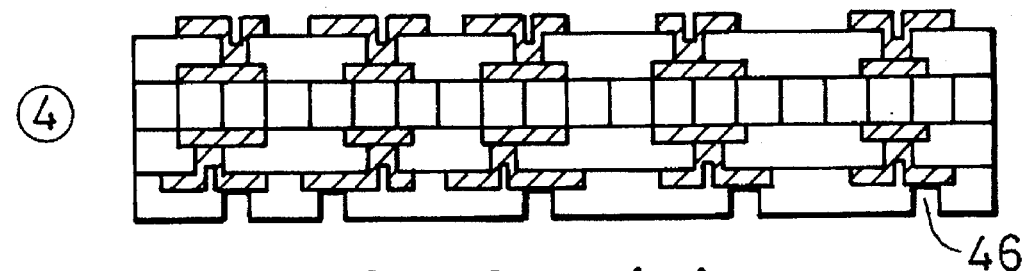
Figure 8E:
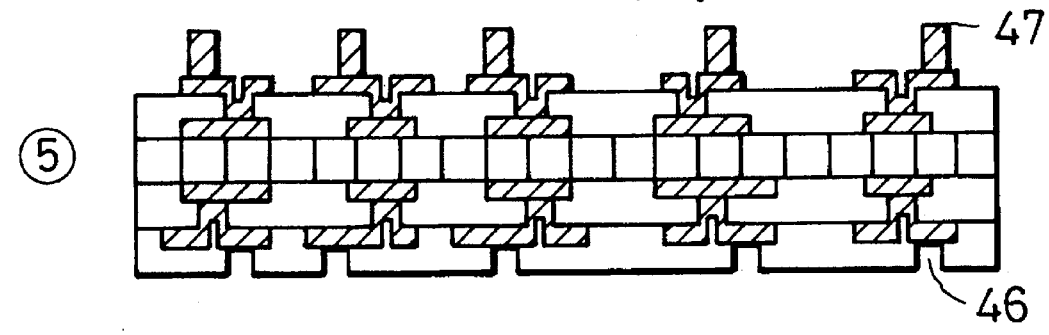
Figure 9F:
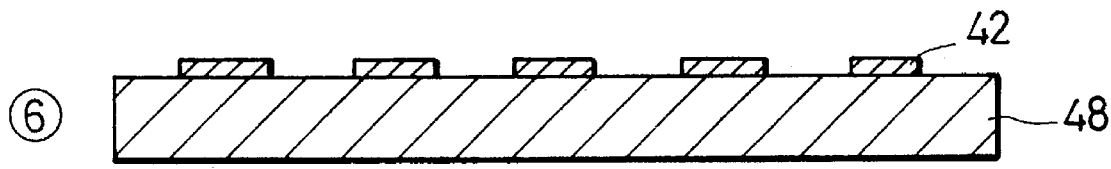
Figure 9G:
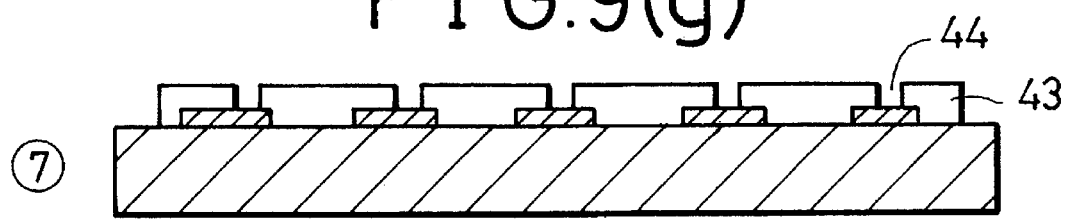
Figure 9H:
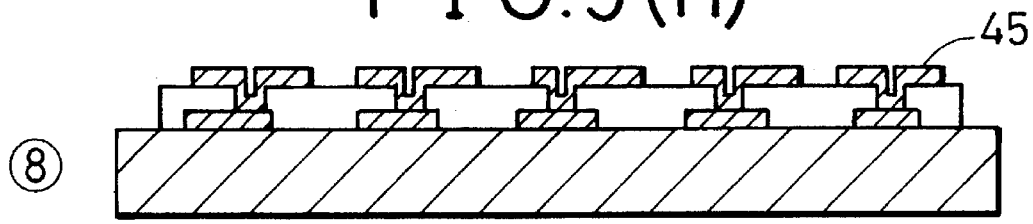
Figure 9I:
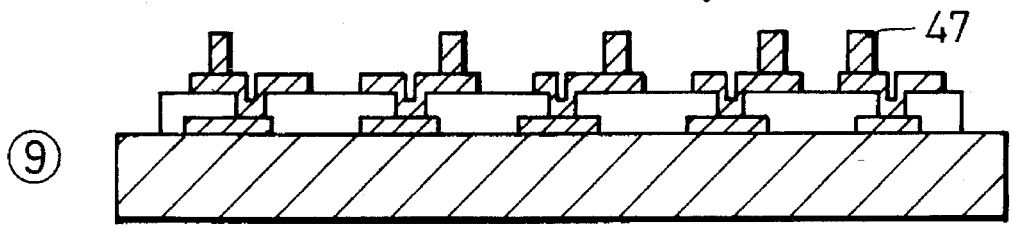

FIGS. 2, 3 and 4 are views showing the succession of steps in a first embodiment of a manufacturing process of a polyimide multilayer wiring substrate of the present invention. The specification of the polyimide multiple wiring layers of the substrate of the first embodiment is the same as that of the embodiment in FIG. 1. Photosensitive polyimide is used as polyimide resin, and gold as the wiring metal.

A manufacturing process of the polyimide multilayer wiring substrate of the first embodiment is as follows: [processes (1) to (13)]

A manufacturing process of a block is first shown in FIG. 2, the block of this process having a ground and a connection wiring layer 22 and a signal wiring layer 25 provided on both the front and rear sides of a ceramic board 21 which contains an internal conductor layer.

Each process described below in drawings (1) to (4) is first carried out on the front side of the ceramic board 21 having an internal conductor layer and then on the rear side thereof. By forming layers alternately on the front and rear sides of the board, stress to the ceramic board caused by the polyimide double-wiring layers is canceled, thereby reducing the warp of the ceramic board.

(1) On the front surface of a ceramic board 21 having an internal conductor layer, a ground and connection wiring layer is patterned by means of photo-lithography using photo-resist, and by applying electrolytic gold plating thereon, a ground and connection wiring layer 22 is formed.

(2) Photosensitive polyimide varnish 23 is applied to the ceramic board having the ground and connection wiring layer formed thereon by process (1), following which the varnish is exposed and developed, and after viaholes 24 are formed at predesignated positions, the varnish is cured.

(3) A signal wiring layer 25 is formed in the same way as the ground and connection wiring layer 22 was formed in process (1). Referring now to FIGS. 2(*a*) through 2(*d*), not that the conductive wiring layers are connected between the polyimide varnish (layer) 23 through viaholes 24.

(4) On the top layer of the double-wiring layers formed in process (3), metal connection bumps 26 are formed at positions which will allow electrical connection with double-wiring layers to be formed in process (5) and subsequent processes. The bumps 26 are patterned by means of photo-lithography using photo-resist, and completed by forming multilayer electrolytic nickel and gold plating. The nickel plating layer functions as a diffusion protection layer against gold/tin particles which, being conductive particles of an anisotropic conductive film, may diffuse into the gold wiring layer. The thickness of each plating is 10 μm for nickel and 3 μm for gold.

The descriptions above relate to the manufacture of a first wiring layer block which constitutes a basic component of the present invention.

Further, as shown in FIG. 3, a ground and connection wiring layer 22 and a signal wiring layer 25 are formed on a ceramic substrate 27 to receive input/output pin 210 to be attached to the rear side of said substrate 27.

(5) The ground and connection wiring layer 22 is patterned by means of photo-lithography using photoresist on the ceramic substrate 27, and electrolytic gold plating is then applied to complete the ground and connection wiring layer.

(6) Photosensitive polyimide varnish 23 is applied to the ceramic board having the ground and connection wiring layer formed by process (5), following which the varnish is exposed and developed, and after viaholes 24 are prepared at predesignated positions, the varnish is cured.

(7) A signal wiring layer 25 is formed in the same way as the ground and connection wiring layer is formed in process (5).

(8) On the polyimide layer formed in process (7), metal connection bumps 26 are formed at positions which will allow electrical connection with the double-wiring layers formed in processes (1) to (4). The bumps 26 are patterned by means of photo-lithography using photo-resist and completed by applying multilayer electrolytic nickel and gold plating. The thickness of the nickel and gold plating is equal to the thicknesses in process (4).

Next, a process for completing the polyimide multilayer wiring substrate of the present invention shown in FIG. 4 will be described. In this process, a plurality of blocks formed by processes (1) to (4) are stacked in layers on the ceramic double-layer substrate made by processes (5) to (8).

(9) After positioning and stacking two polyimide layers having anisotropic conductive film 28 interposed therebetween, one of said layers being the polyimide layer having metal connection bumps 26 formed by process (4) in the polyimide double-wiring layers manufactured on the ceramic board in processes (1) to (4) and including the internal conductor layer, the other being the polyimide double-wiring layers (or "second wiring layers") made by processes (5) to (8) having metal connection bumps 26 formed on the ceramic substrate, the two polyimide layers are pressed against each other and heated to bond and fix them to each other by means of adhesion of the anisotropic conductive film 28. At this time, the gold/tin conductive particles present in the film 28 are crushed between the metal bumps 26, thereby electrically connecting the two multilayer structures. In the area free of metal bumps, no electrical connection occurs in the lateral direction because conductive particles are not crushed, and consequently, there will be no failures caused by a short circuit between adjacent metal bumps. The insulation resistance at this time is not less than $10^9 \Omega$. The pressing and heating method is described below in detail. Here the anisotropic conductive film having a carrier film made of polyester film 50–100 μm thick is used. An anisotropic conductive film cut to the size of the ceramic substrate is first superposed on the polyimide double-wiring layers formed by processes (5) to (8) with metal bumps built on the substrate. The film is provisionally pressed for 2 to 3 seconds at 135° C. and under a pressure of 3–5 kg/cm². The carrier film is then stripped off the anisotropic conductive film, followed by positioning of the polyimide layer having the metal connection bumps formed in process (4) in the polyimide double-wiring layers made in processes (1) to (4) on the ceramic board including an internal conductor layer. After stacking, the above two polyimide layers are pressed for 20 to 30 seconds at a pressure of 30–40 kg/cm² and a temperature of 150° to 160° C. A vacuum hydraulic press is used both for provisional pressing and final pressing, both of which are both performed under a reduced pressure of no more than 10 Torr.

(10) Other polyimide wiring layers formed by processes (1) to (4) on a ceramic board which includes an internal conductor layer are stacked and laminated by method (9) on the polyimide wiring multilayer produced by processes (1) to (9).

(11) Process (10) is repeated until eight tiers of signal wiring layers (i.e., first and second wiring layer blocks) are formed.

(12) A connection electrode layer 29 is formed for connecting the multilayer wiring substrate and LSI chip wiring. Consequently, metal connection bumps are not needed on the top layer of the last block, but in their place, electrode connection pads are formed on the surface of polyimide layer for solder jointing with the bumps of the chip carriers in which LSI chips are sealed. Then, tin.lead eutectic solder is used for connecting the bumps of LSI chip carriers and the connection electrode pads, and the electrode connection pads are formed by applying copper plating which is not etched by tin.lead solder.

(13) Finally, input/output pins and power pins 210 are attached to their predesignated positions on the rear surface of ceramic substrate 27.

FIGS. 5, 6 and 7 are views showing the progression of a second embodiment of the manufacturing process of the polyimide multilayer wiring substrate of the present invention. The specification of the polyimide multiple wiring layers of the polyimide multilayer wiring substrate of the present embodiment is the same as that of the embodiment in FIG. 1. Photosensitive polyimide is used as polyimide resin, and multilayer copper and nickel plating is applied to the wiring metal with a plating thickness of 6.5 μm for the copper plating and 0.5 μm for the nickel plating. Here, since the photosensitive polyimide used in the present embodiment tends to react with metal copper, thereby exerting a harmful influence on polyimide, nickel plating is applied to copper plating as a barrier metal to prevent direct contact of copper and photosensitive polyimide.

The manufacturing process of the polyimide multilayer wiring substrate of the second embodiment is as follows. [processes (1) to (14)]

The manufacturing process of a block is first shown in FIG. 5, wherein the block is formed by providing a ground and connection wiring layer 32 and a signal wiring layer 35 respectively on both the front and rear sides of a hard organic resin board 31 which includes an internal conductor layer.

Each process described below in drawings (1) to (5) is first effected on the front side of the hard organic resin board which has an internal conductor layer, and then on the rear side thereof. By stacking multilayers alternately on the front and rear sides of the board, stress to the hard organic resin board caused by fabrication of the polyimide double-wiring layers is canceled, thereby reducing warpage of the hard organic resin board.

(1) On the surface of the hard organic resin board 31, a ground and connection wiring layer 32 is patterned by means of photo-lithography using photoresist, and after applying electrolytic copper plating thereon, electroless nickel plating is applied to form layer 32.

(2) Photosensitive polyimide varnish 33 is applied to the hard organic resin board which has the ground and connection wiring layer formed by process (1), following which the varnish is exposed and developed. After viaholes 34 are formed at predesignated positions on the board, the varnish is cured.

(3) A signal wiring layer 35 is formed in the same way as the layer 32 is formed in process (1).

(4) Polyimide varnish is applied to the signal wiring layer formed by process (3) only on the front side of the hard organic resin board. After exposing and developing the polyimide varnish, viaholes are provided in predesignated positions and the varnish is cured. The viaholes on the front side of the hard organic resin board are used for connection and are made larger than the metal bumps of the connection partner. For example, connection viaholes 36 are manufactured 30–350 μm in size for metal bumps of 25–300 μm in size. As clearly seen from FIG. 5, metal parts (cross-hatched areas) of the signal wiring layer 35 that contact the connection wiring layer are positioned under each of the viaholes 36.

(5) Connection bumps 37 are formed only on the rear side of the hard organic resin board on top of the double-wiring layers made by process (3) at positions which will enable electrical connection with the double-wiring layers which are formed in process (6) and following processes. The bumps are patterned by means of photo-lithography using photo-resist, and completed by applying electrolytic copper plating. The thickness of the bumps is 60 μm.

The above descriptions relate to the manufacturing of a block which constitutes basic components of the present invention.

Further, as shown in FIG. 6, a ground and connection wiring layer and a signal wiring layer 35 are formed on a ceramic substrate 38, to the rear side of which input/output pins 311 are attached.

(6) A ground and connection wiring layer 32 is patterned by means of photo-lithography using photoresist on the ceramic substrate 38 as described above, and electrolytic copper plating and subsequent electroless nickel plating are then applied to complete the layer 32.

(7) Photosensitive polyimide varnish 33 is applied to the ceramic board on which the ground and connection wiring layer has been formed by process (6), following which the varnish is exposed and developed. Viaholes 34 are prepared at predesignated positions and the varnish is then cured.

(8) A signal wiring layer 35 is formed in the same way as the ground and connection wiring layer is formed in process (6).

(9) Polyimide varnish is applied to the signal wiring layer formed by process (8), following which the varnish is exposed and developed. Viaholes 36 are formed at predesignated positions and the varnish is then cured. Viaholes formed at this time are used for connection and are made larger than the metal bumps with which they will connect. As an example, connection viaholes 36 are manufactured 30–350 μm in size to connect with metal bumps 25–300 μm in size. A process for completing the polyimide multilayer wiring substrate of the present invention shown in FIG. 7 will now be described in which a plurality of blocks formed in processes (1) to (5) are stacked in layers on the ceramic double-layer substrate made in processes (6) to (9).

(10) After positioning and stacking two polyimide layers having an anisotropic conductive film 39 interposed therebetween, one of said layers being the polyimide layer having metal connection bumps 37 formed in process (5) in the polyimide double-wiring layer which has been manufactured on the rear side of the hard organic resin board 31 by processes (1) to (5), the other being the polyimide double-wiring layers made by processes (6) to (9) having connection viaholes 36 formed on the ceramic substrate, the two polyimide layers are pressed against each other and heated to bond and fix them to each other by means of adhesion of anisotropic conductive film 39. At this time, indium/lead conductive particles present in the anisotropic conductive film are crushed between connection bumps 37 formed in process (5) and the wiring metals disposed at the bottom of connection viaholes 36 prepared in process (9) and electrically connect the multilayer structures. In the area having no metal bumps, no conductive particles are crushed and no electrical connection occurs in the lateral direction, and consequently, there will be no failure produced due to short circuits between adjacent metal bumps. Insulation resistance at this time is not less than $10^9 \Omega$.

The method employed in the above pressing and heating process will now be described in detail. An anisotropic conductive film having a carrier film made of polyester film of 50–100 µm thick is used. The anisotropic conductive film is cut to the size of the ceramic substrate having connection viaholes and is superposed on the polyimide double-wiring layers which have been formed in processes (6) to (9.). The film is provisionally pressed for 2 to 3 seconds at a pressure of 3–5 kg/cm² and at a temperature of 135° C., following which the carrier film is stripped off the anisotropic conductive film. The hard organic resin board having polyimide double-wiring layers formed in processes (1) to (5) on its rear side and metal connection bumps formed in process (5) in its polyimide layer is then positioned. After stacking, the two polyimide layers are pressed for 20 to 30 seconds at a pressure of 30–40 kg/cm² and a temperature of from 150° to 160° C. A vacuum hydraulic press is used for provisional pressing and final pressing, both of which are carried out at a reduced pressure no higher than 10 Torr.

(11) Other polyimide wiring layers formed by processes (1) to (5) on the hard organic resin board having an internal conductor layer are stacked and laminated by method (10) on the polyimide wiring multilayer manufactured in processes (1) to (10).

(12) Process (11) above is repeated until eight tiers of signal wiring layers are formed.

(13) A connection electrode layer 310 is formed for connecting the multilayer wiring substrate and LSI chip wiring. Consequently, no connection viaholes are needed on the top layer of the stacked block, but in their place, connection electrode pads are formed on the surface of polyimide layer for solder jointing the bumps of the chip carriers in which LSI chips are sealed. Tin.lead eutectic solder is used for connecting the bumps of the LSI chip carriers and the connection electrode pads, and the connection electrode pads are formed by applying copper plating which is not etched by tin.lead solder.

(14) Finally, input/output pins and power pins 311 are attached to predesignated positions on the rear of ceramic substrate 38.

FIGS. 8, 9 and 10 are views showing the progression of a third embodiment of a manufacturing process of the polyimide multilayer wiring substrate of the present invention. The specification of the polyimide multiple wiring layers of the polyimide multilayer wiring substrate of the third embodiment is the same as that of the embodiment in FIG. 1. Photosensitive polyimide is used as the polyimide resin, and multilayer copper and nickel plating is applied to the wiring metal at a plating thickness of 6.5 µm for the copper plating and 0.5 µm for the nickel plating. Since the photosensitive polyimide to be used in the present embodiment tends to react with copper and exert a harmful influence on polyimide, nickel plating is applied to the copper plating as a barrier metal to prevent the direct contact of the copper and photosensitive polyimide.

The manufacturing process of the polyimide multilayer wiring substrate of the third embodiment is as follows:

A manufacturing process of a block is first shown in FIG. 8 wherein the block is formed by providing a ground and connection wiring single layer 42 and then a signal wiring layer 45 on both sides of a hard organic resin board 41 which includes an internal conductor layer.

Each process described in the following steps (1) to (5) is first effected on the front side of the hard organic resin board which has internal conductor layer, and then on the rear side. By fabricating multilayers alternately on the front and rear sides of the board, stress to the alternate sides of the hard organic resin board 41 caused by fabrication of the polyimide double-wiring layers is canceled, thereby reducing warp of the hard organic resin board.

(1) On the surface of the hard organic resin board 41, a ground and connection wiring layer is patterned by means of photo-lithography using photoresist, and after applying electrolytic copper plating thereon, electroless nickel plating is further applied to complete the formation of a ground and connection wiring layer 42.

(2) Photosensitive polyimide varnish 43 is applied to the hard organic resin board 41 on which the ground and connection wiring layer has been formed in process (1), following which the varnish is exposed and developed, and after viaholes 44 are formed at predesignated positions, the varnish is cured. Metal parts (cross-hatched areas in FIG. 5) of the ground and connection wiring layer 42 that contact the connection wiring layers are positioned under each of the viaholes 44.

(3) A signal wiring layer 45 is formed in the same way as the ground and connection wiring layer was formed in process (1).

(4) Polyimide varnish is applied on the signal wiring layer formed in the above process (3) only on the rear side of the hard organic resin board 41, following which the varnish is exposed and developed, and after viaholes are formed at predesignated positions, the varnish is cured. The viaholes 46 on the rear side of the hard organic resin board are for connection purposes and are made larger than the metal bumps of the corresponding connection partner. For example, the connection viaholes are manufactured 30–350 µm in size for connection with metal bumps 25–300 µm in size.

(5) Connection bumps 47 are formed only on the front side of the board 41 on the top of the double-wiring layers made in process (3) at positions which will allow the bumps to electrically connect with the double-wiring layers to be formed in following process (6) and following processes. The bumps are patterned by means of photo-lithography using photo-resist, and completed by applying electrolytic copper plating. The thickness of the bumps is 60 µm.

The above descriptions relate to the manufacture of a block which constitutes a basic component of the present invention.

Next, as shown in FIG. 9, a ground and connection wiring layer 42 and a signal wiring layer 45 are formed in addition to the above on a ceramic substrate 48, on the rear side of which input/output pins 411 will eventually be fixed.

(6) The ground and connection wiring layer 42 is patterned by means of photo-lithography using photoresist on the ceramic substrate 48 described above, and electrolytic copper plating and subsequent electroless nickel plating are then applied to complete the ground and connection wiring layer 42.

(7) Photosensitive polyimide varnish 43 is applied to the ceramic board having ground and connection wiring layer 42 formed in process (6), following which the varnish is exposed and developed, and after viaholes 44 are prepared at predesignated positions, the varnish is cured.

(8) A signal wiring layer 45 is formed in the same way as the ground and connection wiring layer 42 formed in process (6).

(9) Metal connection bumps 47 are formed on the signal wiring layer 45 formed in the above process (8) at positions which will allow electrical connection with the multiple wiring layers formed in processes (1) to (5) above. The bumps are patterned by means of photo-lithography using photo-resist and completed by applying electrolytic copper plating. The thickness of the bumps is 60 µm.

A process for completing the polyimide multilayer wiring substrate of the present invention shown in FIG. 10 will next be described below, in which a plurality of blocks formed in processes (1) to (5) are stacked in layers on the ceramic double-layer substrate made in processes (6) to (9).

(10) After positioning and stacking two polyimide layers having an anisotropic conductive film 49 interposed therebetween, one of said layers being the polyimide double-wiring layer having connection viaholes 46 formed by process (5) in the polyimide double-wiring layers formed on the rear side of the hard organic resin board 41 through processes (1) to (5), the other being the polyimide double-wiring layers made in processes (6) to (9) having metal connection bumps 47 formed on the ceramic substrate, the two polyimide layers are pressed against each other and heated to bond and fix them to each other by means of adhesion of anisotropic conductive film 49. At this time, indium/lead conductive particles present in the film 49 are crushed between the wiring metals in the wiring layers disposed at the bottom of connection viaholes 46 prepared in process (5) and on the metal connection bumps 47 formed in process (9), resulting in the electrical connection of the two multilayer structures. In areas having no metal bumps, since conductive particles are not crushed, no electrical connection occurs in the lateral direction, and consequently, and no failure is produced due to short circuits between the adjacent metal bumps. Insulation resistance at this time is not less than $10^9 \Omega$. Details of the above pressing and heating method are as follows:

An anisotropic conductive film 49 having a carrier film made of polyester film of 50-100 µm thick is used. The anisotropic conductive film is cut to the size of the ceramic substrate and superposed on the polyimide double-wiring layers formed in processes (6) to (9) above and having metal connection bumps built on the substrate. The conductive film is then provisionally pressed for 2 to 3 seconds at a pressure of 3-5 kg/cm² and a temperature of 135° C., following which the carrier film is stripped from the film. The surface bearing the conductive film is then aligned with the polyimide layer having connection viaholes formed in process (5) in the polyimide double-wiring layers formed in processes (1) to (5) on the rear side of the hard organic resin board. After stacking the two substrates, they are pressed for 20 to 30 seconds at a pressure of 30-40 kg/cm² and a temperature of 150° to 160° C. A vacuum hydraulic press is used for provisional pressing and final pressing, both of which are performed at reduced pressure not higher than 10 Torr.

(11) Other polyimide wiring layers formed in processes (1) to (5) on the hard organic resin board 41 having an internal conductor layer are stacked and laminated according to method (10) above on the polyimide wiring multilayer manufactured in processes (1) to (10).

(12) Process (11) is repeated until eight tiers of signal wiring layers are formed.

(13) A connection electrode layer 40 is then formed for connecting the multilayer wiring substrate and LSI chip wiring. Consequently, no connection bumps are needed on the top stacked layer of the block. In place of the bumps, connection electrode pads are formed on the polyimide layer to provide soldering points for the bumps of the chip carriers in which the LSI chips are sealed. Tin-lead eutectic solder is used for connecting the bumps of the LSI chip carriers and the connection electrode pads, and the connection electrode pads are formed by applying copper plating, which is not etched by tin-lead solder.

(14) Finally, input/output pins and power pins 411 are attached at predesignated positions on the rear side of the ceramic substrate.

In the embodiment described above, the polyimide multiple wiring layers are formed on the ceramic substrate. However, a hard organic resin board 52 such as a substrate formed from polyimide resin may be used in place of the ceramic substrate. As shown in FIG. 11, input/output pins 51 are then driven into the through-holes formed in the substrate 52 formed from polyimide resin. A sectional view of the polyimide multilayer wiring substrate made by using this polyimide resin formed substrate is shown in FIG. 11. The multilayer wiring substrate of the present embodiment has the advantage of a base made of a substrate 52 formed from polyimide resin and a polyimide multiple wiring layers, and hence the thermal expansion coefficients can be precisely equalized, thereby making the substrate suitable for manufacturing large, highly multilayered wiring substrates.

By applying the processes described above, a highly multilayered high-density polyimide multilayer wiring substrate can be manufactured in a remarkably reduced manufacturing time when compared with conventional polyimide-ceramic multilayer wiring substrates which are made by a phased lamination system, and since electrical inspection can be performed by block units and blocks of high-quality components can be selectively stacked in multilayers, a high production yield can also be achieved with these new processes.

Figure 12:
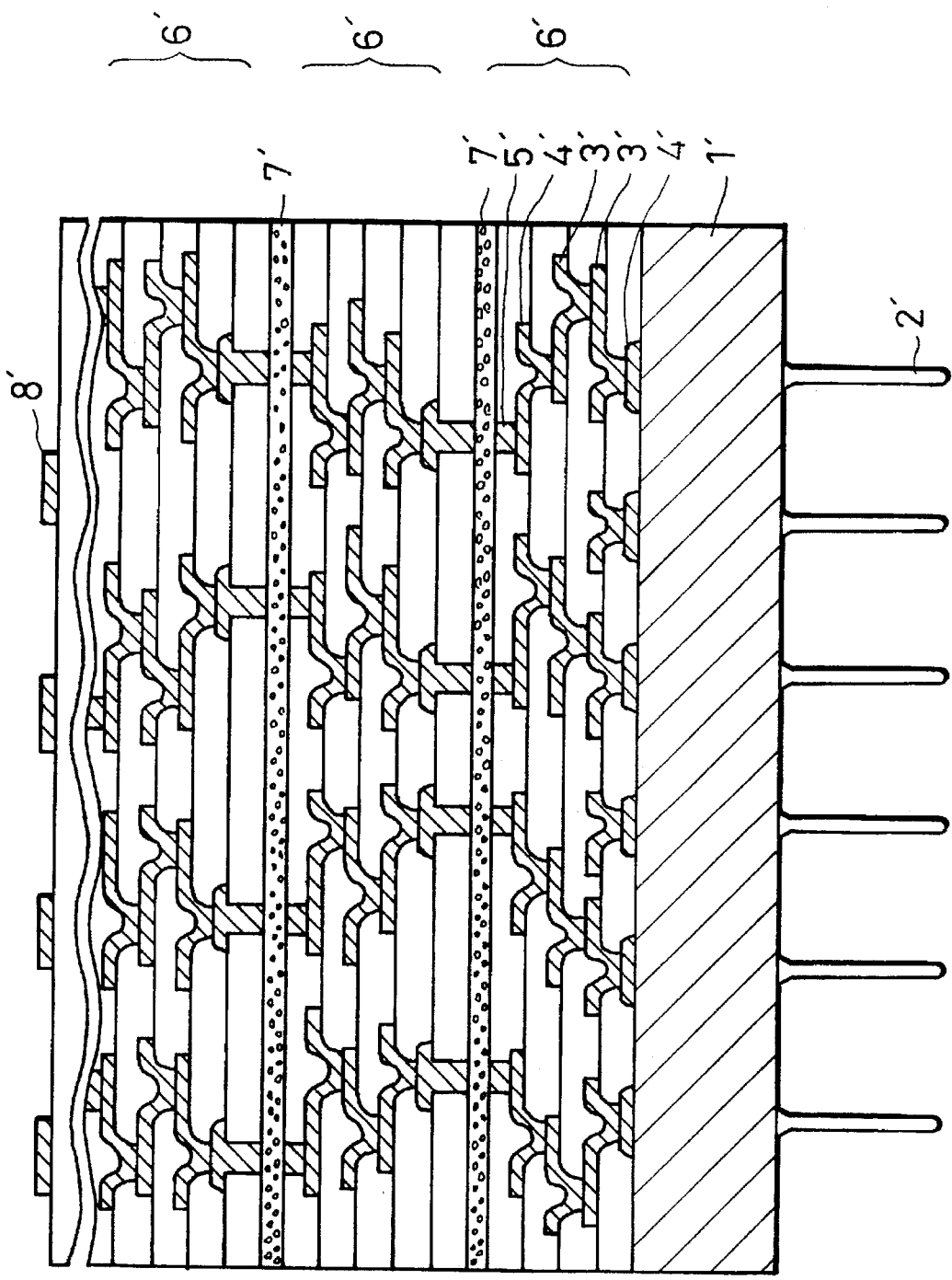
FIG. 12 is a sectional view of a fourth embodiment of a polyimide multilayer wiring substrate of the present invention.

FIG. 12 is a sectional view showing a fourth embodiment of the polyimide multilayer wiring substrate of the present invention. In FIG. 12, the reference numerals can be identified as follows:

1' a co-fired alumina ceramic substrate provided with power pins and input/output pins 2' on the rear side which includes an internal wiring layer made of molybdenum metal 3' a pair of signal wiring layers consisting of, for example, X- and Y-direction gold-plated wiring 25 µm wide and 5 µm thick 4' a pair of ground and connection wiring layers provided both above and under the pair of signal wiring layers 3' for adjustment of impedance and reduction of crosstalk noise 5' metal connection bumps made of nickel-gold bump produced by applying gold plating on nickel plating to form bumps with the dimensions, for instance, 25-300 µm square and 10-50 µm thick 6' wiring blocks composed of the above signal wiring layers 3', ground and connection wiring layers 4' and metal connection bumps 5'

7' an anisotropic conductive film provided between the metal connection bumps 5' of wiring blocks 6' which electrically connect the upper and lower wiring blocks 6' by means of conductive particles existing in the film 8' For example, copper-plated LSI connection pads to which an LSI chip is soldered In the embodiment, the four wiring layer blocks 6' are stacked in layers.

For the polyimide resins, either photo-unsensitive resins (for example, PIQ of Hitachi Chemical Co., Ltd., PYRALIN of Dupont, SEMICOFINE of Toray Industries, Inc.), or photo-sensitive resins (for example, PL-1200 of Hitachi, PI-2702D of Dupont, PHOTONEECE of Toray and PIMEL of Asahi Chemical Industry Co., Ltd.) can be used with the film thickness between each wiring layer being 20 µm.

The thickness of the anisotropic conductive film 7' is in the range of 20-30 µm, and the conductive particles present in the film are 5-25 µm in diameter with a density of 5-20% by volume (for example, SUMIZAC 1003 of Sumitomo Bakelite Co., Ltd.).

The wiring layer blocks 6' are electrically inspected when completed in order to select blocks of good quality and then proceed to the next process in which the blocks are interconnected.

Figure 14A:
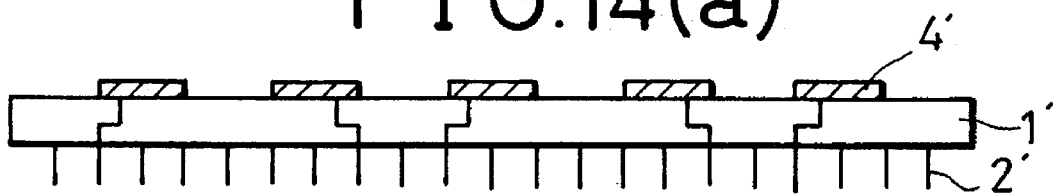
Figure 14B:
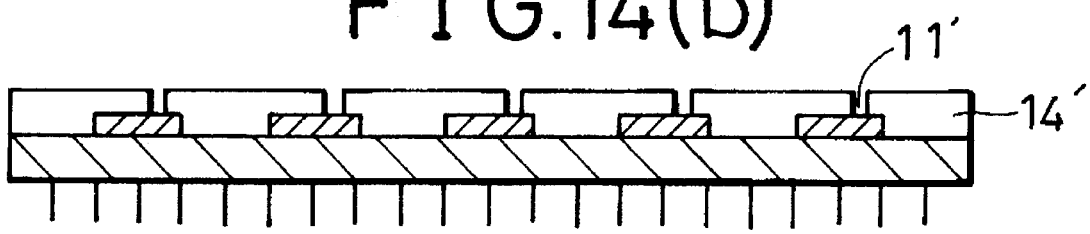
Figure 14C:
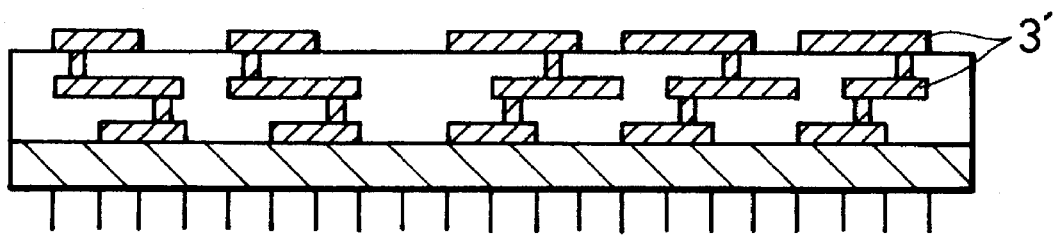
Figure 14D:
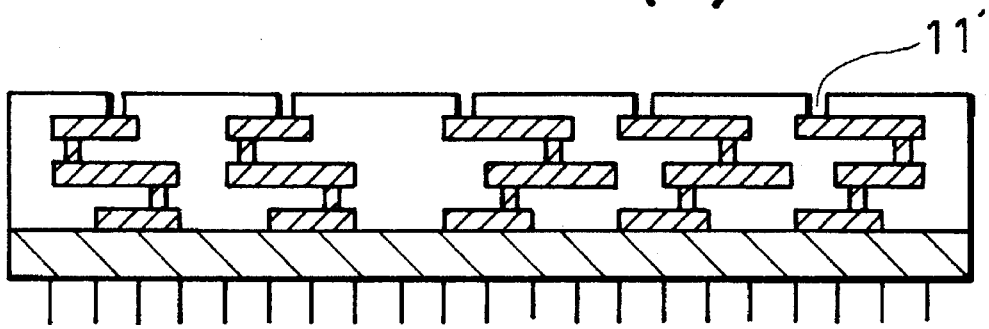
Figure 14E:
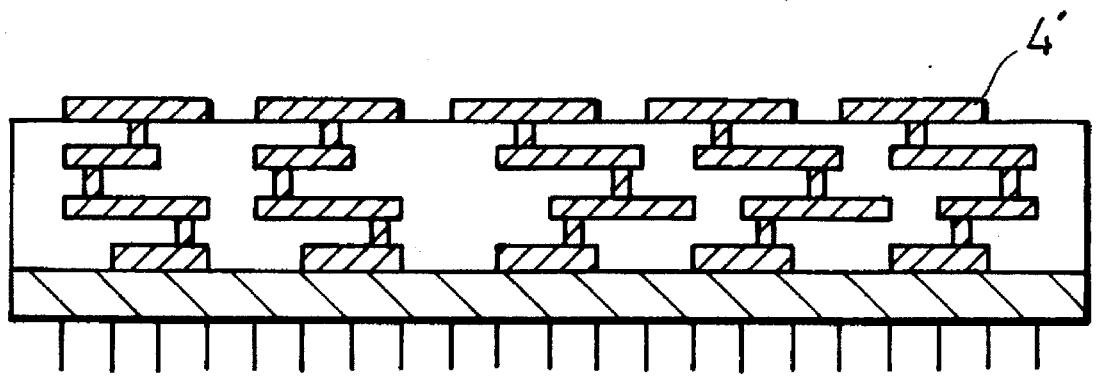
Figure 14F:
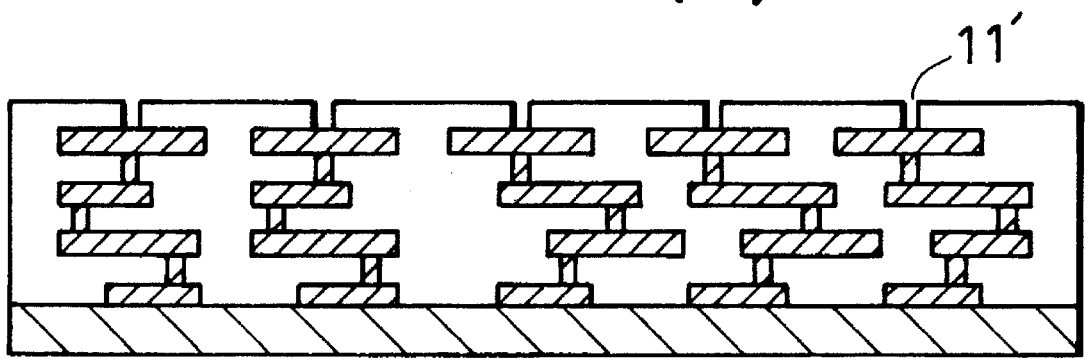
Figure 14G:
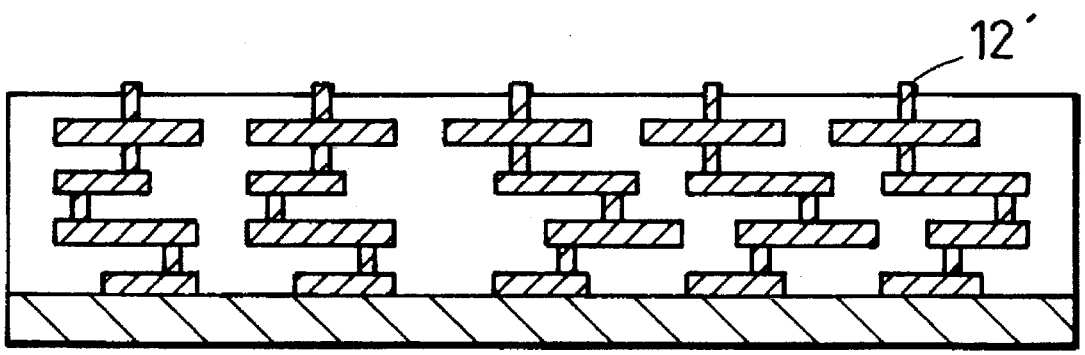
Figure 15A:
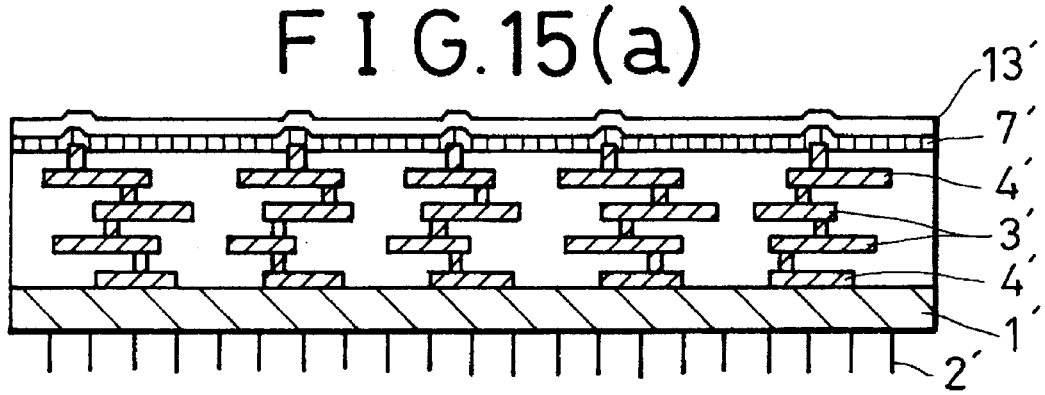
Figure 15B:
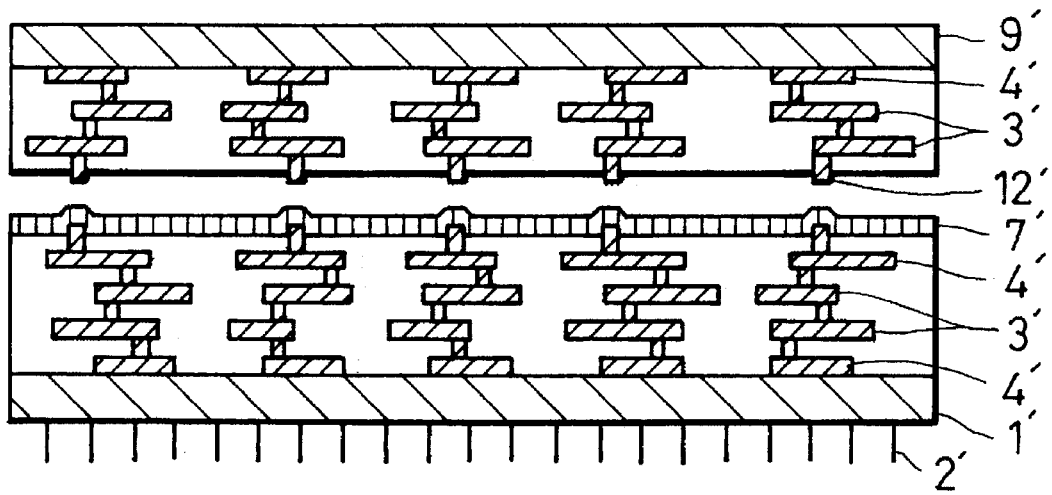

FIG. 13, FIG. 14, and FIG. 15 are views showing embodiments of the manufacturing method of the polyimide multilayer wiring substrate shown in FIG. 12.

The specification of the polyimide multiple wiring layers of the polyimide multilayer wiring substrate of the present embodiment is the same as that of the embodiment in FIG. 12. Photosensitive polyimide is used as polyimide resin, and gold as the wiring metal.

Figure 13A:
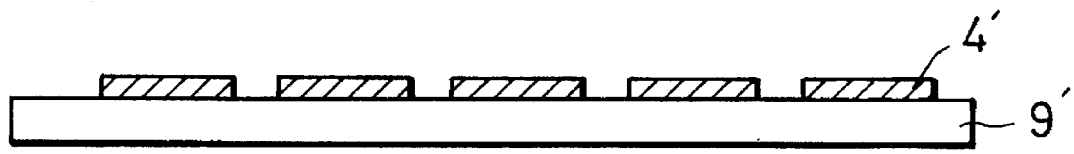
FIGS. 13a–13e, 14a–14g, and 15a–15c illustrate the succession of steps in a fourth embodiment of manufacturing method of the substrate of the invention.

A pair of signal wiring layers 3' and an arrangement of ground and connection wiring layer 4' are first formed on a flat aluminum board 9' (hereinafter referred to as aluminum board) according to the following method:

In step $S_1$, ground and connection layer 4' is patterned by means of photo-lithography using photoresist on aluminum board 9' as shown in FIG. 13(a) and is completed by applying electrolytic gold plating.

Figure 13B:
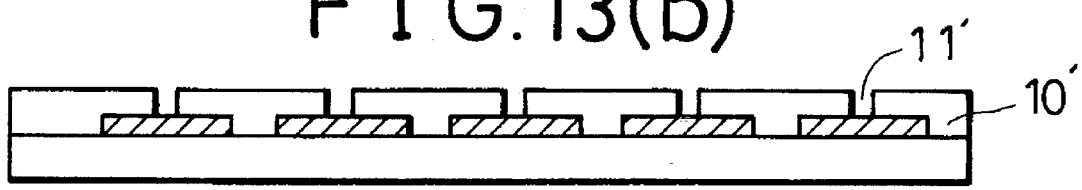

In step $S_2$, as shown in FIG. 13(b), photosensitive polyimide varnish 10' is applied to the aluminum board 9' which has the ground and connection wiring layer 4' formed thereon in step $S_1$. The photosensitive varnish is then exposed and developed, and Viaholes 11' are prepared at predesignated positions, following which the varnish is cured.

Figure 13C:
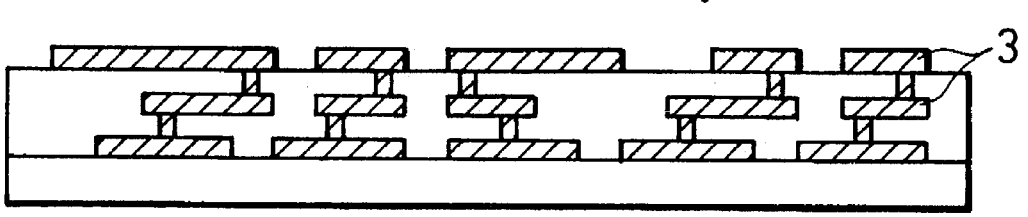

In step $S_3$, a pair of signal wiring layers 3' are formed by using photosensitive polyimide for interlayer insulation as shown in FIG. 13(c). The signal wiring layers 3' are formed by the same method in which the ground and connection wiring layer 4' is made in step $S_1$, and the insulation layer between the signal layers is formed according to the method by which the insulation layer is produced in step $S_2$.

Figure 13D:
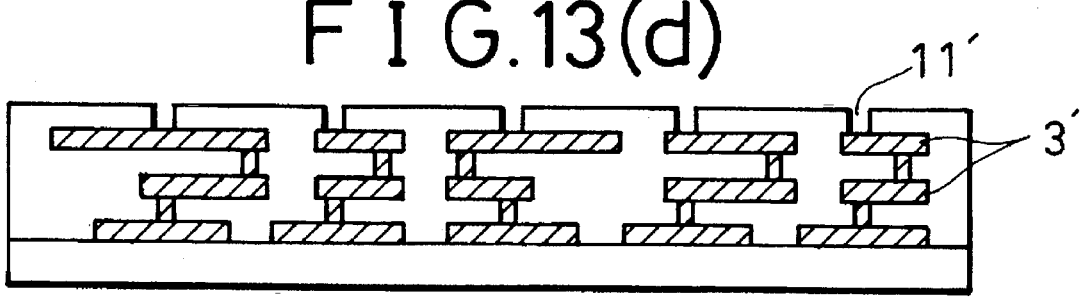

In step $S_4$, as shown in FIG. 13(d), polyimide varnish is applied to the second signal wiring layer 3' formed in step $S_3$, following which it is exposed and developed, and after viaholes 11' are prepared at predesignated positions, the varnish is cured.

Figure 13E:
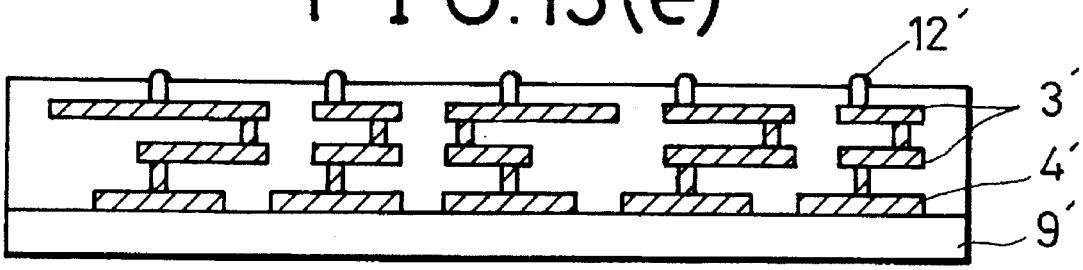

In step $S_5$, metal connection bumps 12' are formed on the top of the multiple wiring layers formed in step $S_4$ as shown in FIG. 13(e) at positions which will allow electrical connection with the multiple wiring layers which will be formed in step $S_6$ and following steps. The bumps 12' are patterned by means of photo-lithography using photo-resist and completed by applying multilayer electrolytic nickel and gold plating. The nickel plating layer functions as a diffusion protection layer against gold/tin particles which, being the conductive particles of the anisotropic conductive film, may diffuse into the gold wiring layer. The thickness of each plating is 10 µm for nickel and 3 µm for gold.

In addition, a pair of signal wiring layers sandwiched by a pair of ground and connection wiring layers 4' are formed on a ceramic substrate 1' which has power pin and input/output pin 2' on the rear side.

In step $S_6$, shown in FIG. 14(a), a ground and connection wiring layer 4' is patterned by means of photo-lithography using photo-resist on the ceramic substrate 1' which is provided with input/output signal pins and power pins 2' disposed on its rear side, following which electrolytic gold plating is applied to complete the ground and connection wiring layer.

In step $S_7$, shown in FIG. 14(b), photosensitive polyimide varnish 14' is applied to the ceramic substrate on which ground and connection wiring layers 4' were formed in step $S_6$. The varnish is exposed, developed, and, following preparation of viaholes 11' at predesignated positions, cured.

In step $S_8$, a pair of signal wiring layers 3' are formed with photosensitive polyimide to provide interlayer insulation as shown in FIG. 14(c). The signal wiring layers 3' are formed through the use of the same method as is used for the ground and connection wiring layer in step $S_1$. The insulation layer between the signal layers is formed using the method by which the insulation layer is produced in step $S_2$.

In step $S_9$, shown in FIG. 14(d), photosensitive polyimide varnish is applied to the signal wiring layer formed in step $S_8$. The varnish is then exposed, developed, and, following preparation of viaholes 11' at predesignated positions, cured.

In step $S_{10}$, as shown in FIG. 14(e), a second ground and connection wiring layer 4' is formed on the polyimide layer produced in step $S_9$ according to the method employed in step $S_6$.

In step $S_{11}$, a polyimide layer having viaholes 11' produced in the same way as in step $S_9$ is formed on the second ground and connection wiring layer as shown in FIG. 14(f).

In step $S_{12}$, shown in FIG. 14(g), metal connection bumps 12' are formed on the polyimide layer formed in step $S_{11}$ at positions which will allow electrical connection with the multiple wiring layer formed in steps $S_1$ through Step $S_5$ above. The bumps 12' are patterned by means of photo-lithography using photo-resist and completed by applying multilayer electrolytic nickel and gold plating. Each nickel and gold plating is of the same thickness as in step $S_5$ above.

In step $S_{13}$, after positioning and stacking two polyimide layers having an anisotropic conductive film 7' interposed therebetween as shown in FIG. 15(a),(b), one of said layers being a polyimide layer having metal connection bumps 12' formed in step $S_5$ in the polyimide multiple wiring layer formed on the aluminum board in steps $S_1$ through $S_5$ above, the other being the polyimide multiple wiring layer made in steps $S_6$ through $S_{12}$ and having metal connection bumps 12' formed on the ceramic substrate, the two polyimide layers are pressed and heated to bond and fix them to each other by means of the adhesion of the anisotropic conductive film 7'. Gold/tin conductive particles present in the anisotropic conductive film 7' are crushed between the metal connection bumps 12' formed in steps $S_5$ and $S_{12}$ to effect electrical connection between the two multilayer structures. In the area having no metal connection bumps 12', no conductive particles are crushed and no electrical connection occurs in the lateral direction, thereby avoiding failures produced due to short circuit between adjacent metal bumps 12'. Insulation resistance at this time is no less than $10^9 \Omega$. As a detailed description of the pressing and heating method, an anisotropic conductive film 7' is employed which has a carrier film 13' made of polyester film 50-100 µm thick.

The anisotropic conductive film 7' is cut to the size of the ceramic substrate and superposed on the polyimide multiple wiring layers formed in steps $S_6$ through $S_{12}$ which have metal connection bumps 12' formed on the substrate, following which the film is provisionally pressed for 2 to 3 seconds at a pressure of 3–5 kg/cm² at a temperature of 135° C. Subsequently, the carrier film 13' is stripped off the anisotropic conductive film 7', followed by alignment of the polyimide layer metal connection bumps 12' formed in step $S_5$ in the polyimide multiple wiring layers formed in steps $S_1$ to $S_5$ on the aluminum board. After stacking, the substrate and aluminum board are pressed against each other for 20 to 30 seconds at a pressure of 30–40 kg/cm² and at a temperature of 150°–160° C. A vacuum hydraulic press is used for provisional pressing and final pressing, both of which are carried out at reduced pressure not higher than 10 Torr.

Figure 15C:
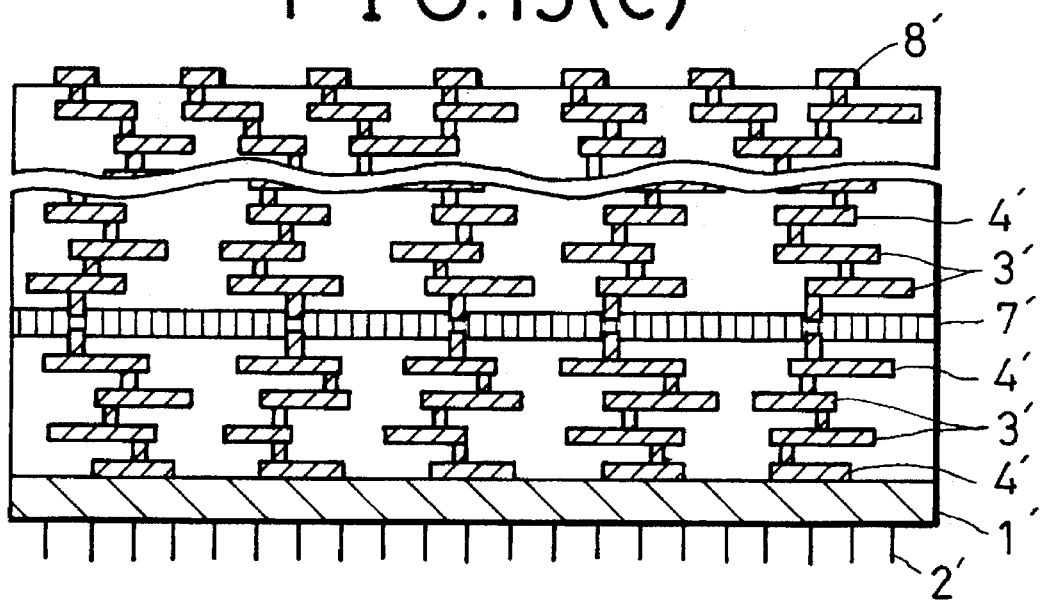

Steps $S_{14}$ through $S_{19}$ are shown in FIG. 15(c). In step $S_{14}$, the aluminum board portion of the already bonded substrate is immersed in a 16% HCl aqueous solution to dissolve and remove the aluminum board 9'. In step $S_{15}$, photosensitive polyimide varnish is applied to the ground and connection wiring layer formed in step $S_1$ and newly exposed in step $S_{14}$. The polyimide varnish is then exposed and developed, and finally, after preparing viaholes at predesignated positions, cured. In step $S_{16}$, the metal connection bumps 12' are formed on the polyimide layer produced in step $S_{15}$. The forming method is the same as the method of step $S_{12}$. In step $S_{17}$, the other polyimide wiring layers formed in steps $S_1$ to $S_5$ are stacked and laminated by the methods employed in steps $S_{13}$ to $S_{16}$ on the polyimide wiring multilayer formed in steps $S_1$ to $S_{16}$. In step $S_{18}$, step $S_{17}$ is repeated until eight tiers of wiring layers are obtained. Finally, in step $S_{19}$, connection electrode layers are formed for connecting the multilayer wiring substrate and LSI chip wiring. In other words, in step $S_{18}$, steps $S_{13}$ to $S_{15}$ are carried out and then LSI connection electrode pads 8' are formed for soldering with the bumps of an LSI-chip-sealed chip carrier on the polyimide layer produced in step $S_{15}$. Tin-lead eutectic solder is used for connecting the bumps of the LSI chip carrier and the electrode connection pads which are formed by applying copper plating to prevent penetration by tin-lead solder.

FIG. 16 shows a fifth embodiment of the manufacturing method of the polyimide multilayer wiring substrate shown in FIG. 12.

The specification of the polyimide multiple wiring layer of the polyimide multilayer wiring substrate of the present embodiment is the same as that of the embodiment in FIG. 12. Photosensitive polyimide is used as the polyimide resin, and multilayer copper and nickel plating is applied to the wiring metal with a plating thickness of 6.5 µm for the copper plating and 0.5 µm for the nickel plating. Since the photosensitive polyimide to be used in the present embodiment tends to react with metal copper, thereby exerting a harmful influence on polyimide, nickel plating is applied to the copper plating as a barrier metal to prevent direct contact between the metal copper and photosensitive polyimide.

The manufacturing process of the polyimide multilayer wiring substrate of the present embodiment is as follows:

A pair of signal wiring layers and a ground and connection wiring layer are first formed on a flat aluminum board (hereinafter referred to as the aluminum board) according to steps $S_{21}$ to $S_2$ below.

Figure 16A:
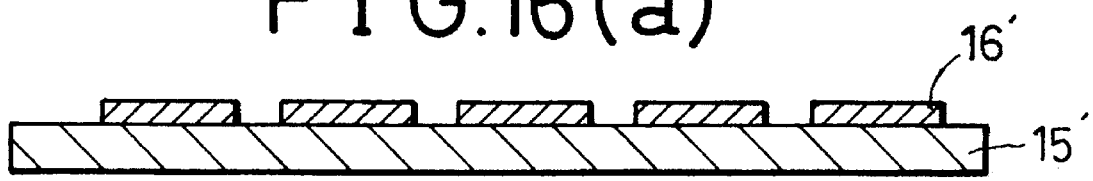

In step $S_{21}$, a ground and connection wiring layer is patterned by means of photo-lithography using photo-resist on the aluminum board 15' as shown in FIG. 16(a), following which electrolytic copper plating and subsequent electroless nickel plating are applied to complete the ground and connection wiring layer 16'.

Figure 16B:
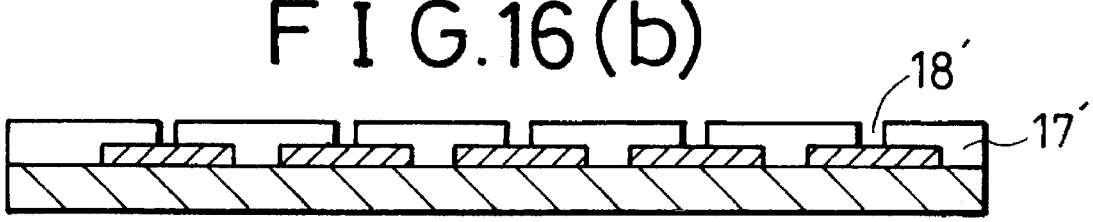

In step $S_{22}$, shown in FIG. 16(b), photosensitive polyimide varnish 17' is applied to the aluminum board which has the ground and connection wiring layer formed in step $S_{21}$. The varnish is then exposed and developed. Following the preparation of viaholes 18' at predesignated positions, the varnish is cured.

Figure 16C:
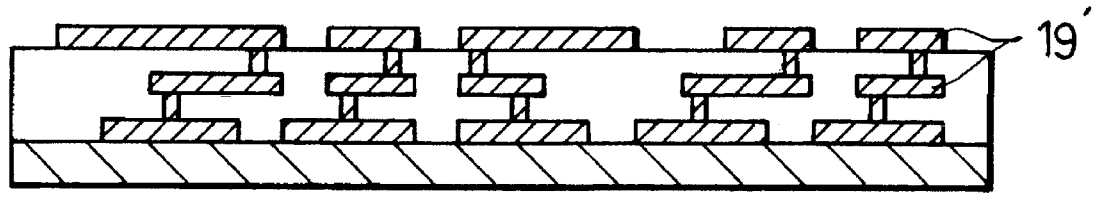

In step $S_{23}$, a pair of signal wiring layers 19' are formed using photosensitive polyimide for interlayer insulation as shown in FIG. 16(c). The signal wiring layers are formed by the method employed for the ground and connection wiring layer in step $S_{21}$, and the insulation layer between the signal layers is formed according to the method employed for the insulation layer in step $S_{22}$. The nickel plating applied to the second signal wiring layer also functions as a diffusion prevention layer to prevent diffusion of conductive indium/lead particles of the anisotropic conductive film into the copper-plated wiring layer.

Figure 16D:
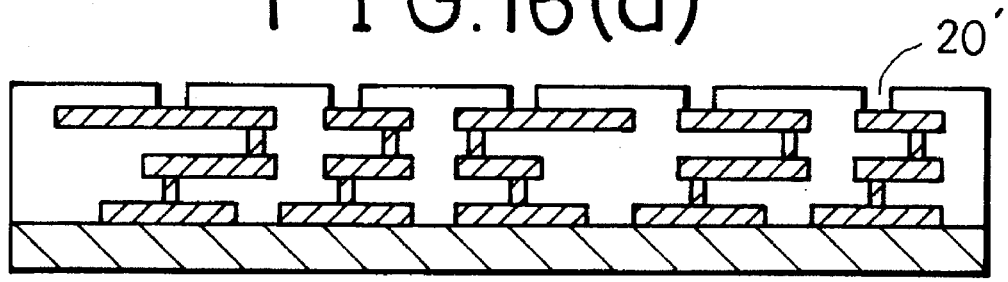

In step $S_{24}$, polyimide varnish is applied to the second signal wiring layer formed in step $S_{23}$, as shown in FIG. 16(d). The polyimide varnish is then exposed, developed, and, following the preparation of connection viaholes 20' at predesignated positions, cured. The connection viaholes are made larger than the metal bumps of the corresponding connection partner. For example, the connection viaholes are manufactured 30–350 µm in diameter to receive the metal bumps 25–300 µm in diameter.

Next, a pair of signal wiring layers 19' which are sandwiched by a pair of ground and connection layers 16' are formed on the ceramic substrate 22' which has input/output pins 21' on its rear side.

Figure 17A:
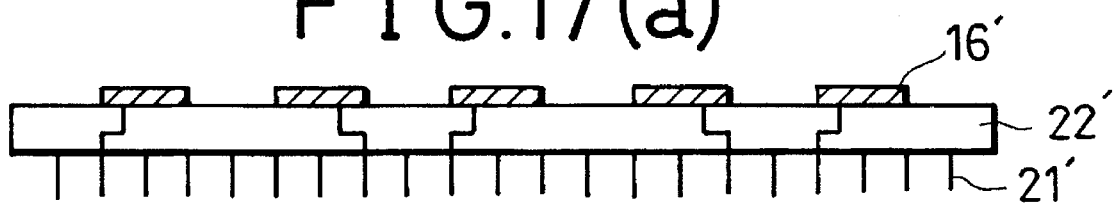

In step $S_{25}$, shown in FIG. 17(a), a ground and connection wiring layer 16' is patterned by means of photo-lithography using photo-resist on a ceramic substrate 22' on the rear side of which input/output signal pins and power pins 21' have been attached, following which electrolytic copper plating and a subsequent electroless nickel plating are applied to complete the ground and connection wiring layer.

Figure 17B:
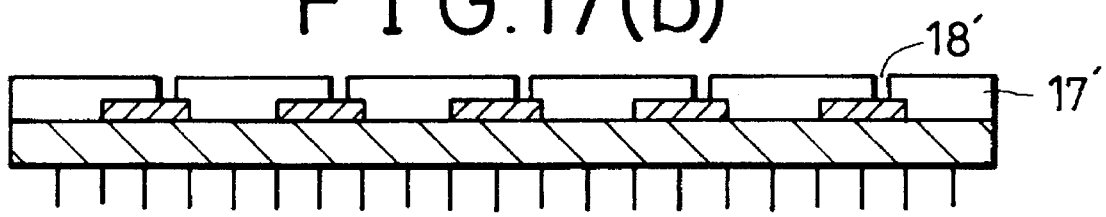

In step $S_{26}$, shown in FIG. 17(b), photosensitive polyimide varnish 17' is applied to the ceramic substrate having the ground and connection wiring layer 16' formed in step $S_5$. The varnish is then exposed and developed, and after viaholes 18' are prepared at the predesignated positions, the varnish is cured.

Figure 17C:
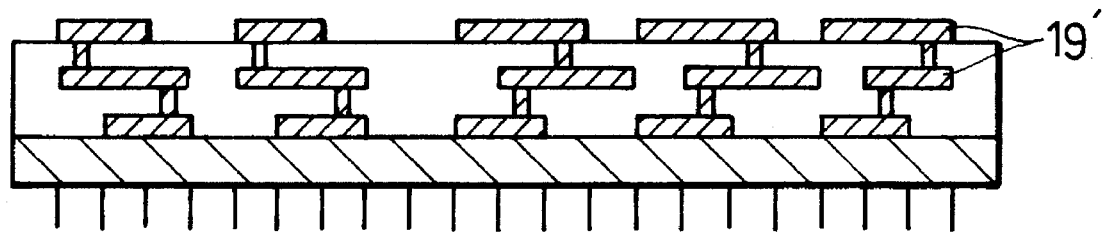

In step $S_{27}$, a pair of signal wiring layers 19' are formed by using photosensitive polyimide as interlayer insulation, as shown in FIG. 17(c). The signal wiring layer is formed by the same method employed for the ground and connection wiring layer in step $S_{21}$, and the insulation layer between the signal layers is formed according to the same method employed for forming the insulation layer in step $S_{22}$.

Figure 17D:
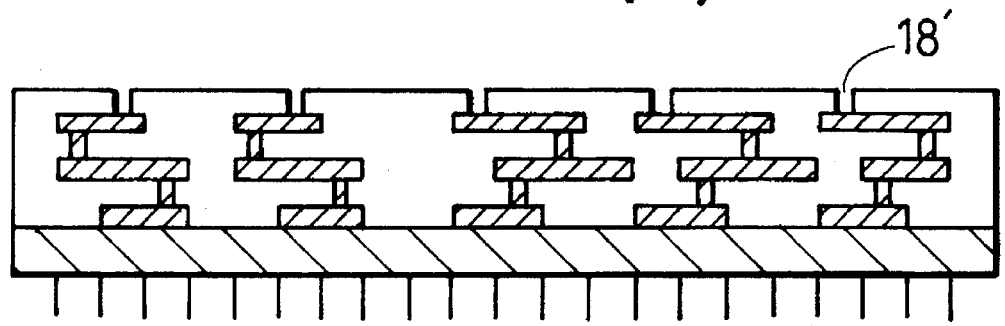

In step $S_{28}$, photosensitive polyimide varnish is applied to the signal wiring layer formed in step $S_{27}$ as shown in FIG. 17(d). The varnish is exposed and developed, and after preparing viaholes 18' at predesignated positions, the varnish is cured.

As shown in FIG. 17(e), in step $S_{29}$ a second ground and connection wiring layer 23' is formed on the polyimide layer produced in step $S_{28}$ according to the method employed in step $S_{26}$.

In step $S_{30}$, the polyimide layer having viaholes 18' produced as in step $S_{28}$ is formed on the second ground and connection wiring layer, as shown in FIG. 17(f).

In step $S_{31}$, shown in FIG. 17(g), metal connection bumps 24' are formed on the polyimide layer produced in step $S_{30}$ at position which will enable electrical connection with multiple wiring layer formed in steps $S_{21}$ through $S_{24}$ above. The metal connection bumps are patterned by means of photo-lithography using photo-resist, and completed by applying electrolytic copper plating. The bumps are 60 µm thick.

Figure 18A:
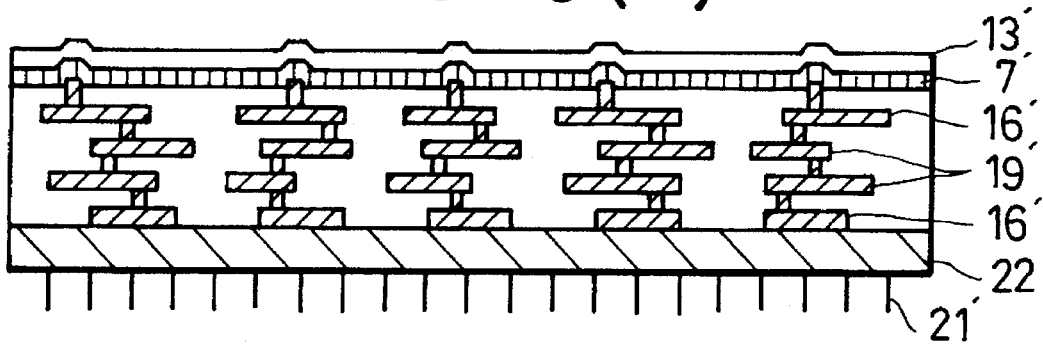
Figure 18B:
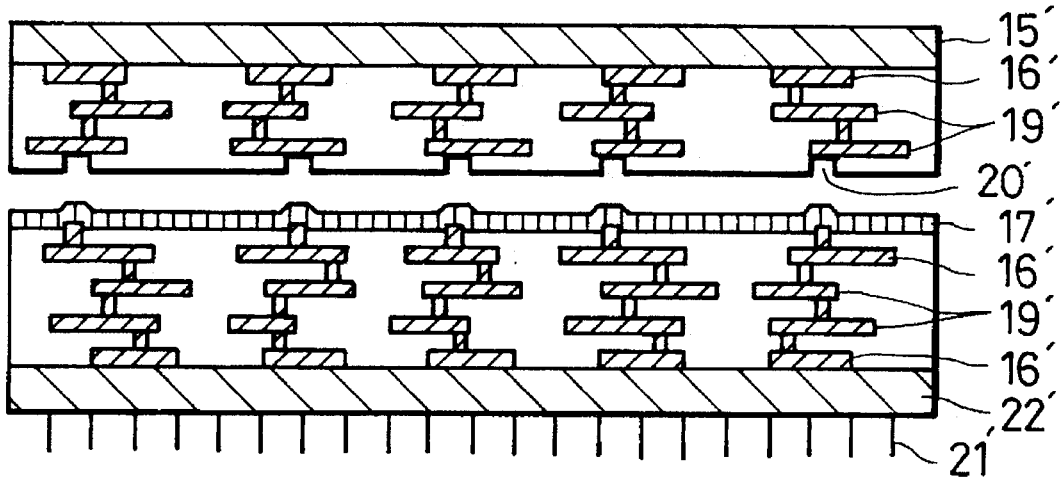

In step $S_{32}$, after positioning and laminating two polyimide layers having an anisotropic conductive film inserted therebetween as shown in FIG. 18(a),(b), one of the polyimide layers being the polyimide layer having connection viaholes 20' formed in step $S_{24}$ in the polyimide multiple wiring layer formed on the aluminum board in steps $S_{21}$ to $S_{24}$ and the other being the polyimide multiple wiring layers formed in steps $S_{25}$ to $S_{31}$ and having metal connection bumps formed on the ceramic substrate, the two polyimide layers are pressed and heated to bond and fix them to each other by means of adhesion of the anisotropic conductive film.

Indium/lead conductive particles present in the anisotropic conductive film are crushed between the wiring metals disposed at the bottom of the connection viaholes 20' formed by step $S_{24}$ and metal bumps formed by step $S_{31}$, thereby effecting an electrical connection between the two multilayer structures. In the area having no metal connection bumps, conductive particles are not crushed and as a result, no electrical connection will occur in the lateral direction. Consequently, no failures will occur due to short circuits between adjacent metal bumps. Insulation resistance at this time is not less than $10^9 \Omega$. The pressing and heating method is as follows:

The anisotropic conductive film employed has a carrier film made of polyester film 50–100 μm thick. The anisotropic conductive film is cut to the size of the ceramic substrate and is superposed on the polyimide multiple wiring layers formed in steps $S_{25}$ to step $S_{31}$ and having metal connection bumps formed on the ceramic substrate. The conductive film is then provisionally pressed for 2 to 3 seconds at a pressure of 3 to 5 kg/cm² and a temperature of 135° C. The carrier film is stripped off the anisotropic conductive film, followed by alignment with the polyimide layer having connection viaholes 20' formed in step $S_{24}$ in polyimide multiple wiring layer 19' made in steps $S_{21}$ to step $S_{24}$ on the aluminum board. After stacking, the above aluminum board and substrate are pressed for 20 to 30 seconds at a pressure of 30–40 kg/cm² and a temperature of 150°–160° C. A vacuum hydraulic press is used for provisional pressing and final pressing, both of which are performed under a reduced pressure not higher than 10 Torr.

Figure 18C:
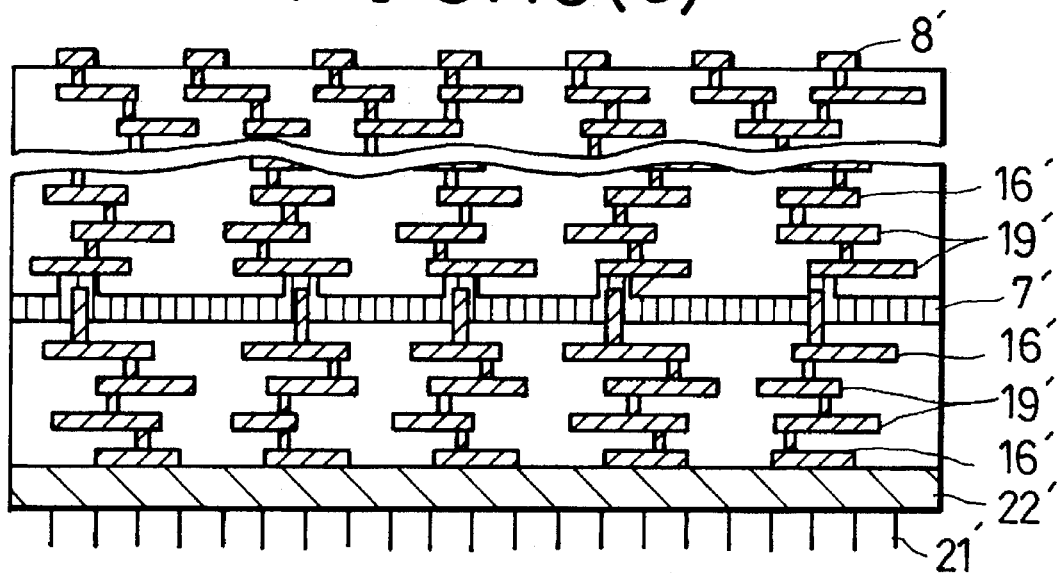

Steps $S_{33}$ to step $S_{38}$ are shown in FIG. 18(c). In step $S_{33}$, the aluminum board portion of the above substrate which has been bonded is immersed in a 16% HCl aqueous solution to dissolve and remove the aluminum board.

In step $S_{34}$, photosensitive polyimide varnish is applied to the ground and connection wiring layer formed in step $S_{21}$ and newly exposed in step $S_{33}$. The varnish is then exposed and developed, and after preparing viaholes at predesignated positions, the varnish is cured.

In step $S_{35}$, metal connection bumps are formed on the polyimide layer produced in step $S_{34}$. The forming method employed is the same as the method of step $S_{31}$.

In step $S_{36}$, a plurality of other polyimide wiring layers formed in steps $S_{21}$ to $S_{24}$ are stacked and laminated using the methods of steps $S_{32}$ to $S_{35}$ on the polyimide wiring multilayer manufactured in steps $S_{21}$ to $S_{35}$.

In step $S_{37}$, step $S_{36}$ is repeated until eight tiers of wiring layers are obtained.

Finally, in step $S_{38}$, a connection electrode layer is formed for connecting the multilayer wiring substrate with LSI chip wiring. In other words, steps $S_{31}$ to $S_{34}$ are repeated in step $S_{38}$ following which electrode connection pads 8' are formed for soldering with the bumps of an LSI-chip-sealed chip carrier on the polyimide layer produced in step $S_{34}$. Tin-lead eutectic solder is used for connecting the bumps of the LSI chip carrier and the connection electrode pad, and the electrode connection pads are formed by applying copper plating which prevents penetration by tin-lead solder.

In the embodiment described above, the polyimide multiple wiring layers are formed on a ceramic substrate. However, a hard organic resin board such as a substrate formed from polyimide resin may be used in place of the ceramic substrate. The input/output pins 21' are attached by being driven into through-holes provided in a substrate 25' formed from polyimide resin. A sectional view of the polyimide multilayer wiring substrate made by using such a substrate formed from polyimide resin is shown in FIG. 19.

The multilayer wiring substrate of the present embodiment is advantageous in that a base made of a substrate formed from polyimide resin and polyimide multiple wiring layers will have exactly equal thermal expansion coefficients, and therefore, can be easily adapted for manufacturing large, highly multilayered wiring substrates.

By using the processes described above, a highly multilayered high-density polyimide multilayer wiring substrate can be manufactured in a remarkably reduced time as compared with conventional polyimide-ceramic multilayer wiring substrates made by a phased lamination system, and since electrical inspection can be performed in block units and blocks of good quality can be selected and stacked in multilayers, a high production yield can be achieved.

As described above, the polyimide multilayer wiring substrate of the present invention has a structure comprising a plurality of blocks stacked in multilayers, each block being made up of a plurality of wiring layers provided on both sides of a ceramic board or hard organic resin board which has an internal conductor layer, and each block being electrically interconnected by means of an anisotropic conductive film inserted between the blocks. With the above-described substrate of the present invention, there is no need for the penetrating through-holes required in conventional polyimide multilayer wiring substrates, and since a delicate pattern can therefore be formed on signal wiring layers, the signal wiring capacity can be greatly increased and highly multilayered high-density wiring can be achieved. In addition, the repeated curing processes required for conventional polyimide-ceramic multilayer wiring substrates is unnecessary in the present invention, resulting in a reduction in the manufacturing time of wiring substrates and the prevention of deterioration of the polyimide resin due to repeated curing. Furthermore, because electrical inspection of wiring layers can be performed by block units, the process of this invention enables stacking of blocks in multilayers after selection of good blocks. Since a ceramic board or hard organic resin board having an internal conductor layer is contained in the thin-film multiple wiring layer, defects in the polyimide resin such as cracks, separation from the ceramic board, or cracks in the ceramic board can be reduced even when many layers are stacked in the thin-film multiple wiring layer. Therefore, the advantages of the present invention are that it enables the production of a high-quality, highly multilayered, high-density polyimide multilayer wiring substrate in a reduced manufacturing time and at a high production yield.

It is to be understood that variations and modifications of the invention disclosed herein will be evident to those skilled in the art. It is intended that all such modifications and variations be included within the scope of the appended claims.

What is claimed is:

1. A method for manufacturing a polyimide multilayer wiring substrate comprising the steps of:

a) forming a plurality of first wiring layer blocks, each of said first wiring layer blocks being formed by forming a layered structure of conductive wiring layers and polyimide layers on two surfaces of one of a ceramic board and a hard organic resin board having an internal conductive layer, each of said polyimide layers of said first wiring layer blocks being formed between two successive layers of said conductive wiring layers of said first wiring layer blocks, and by forming metal bumps in electrical contact with said conductive wiring layers on top and bottom surfaces of each of said first wiring layer blocks, said conductive wiring layers of said first wiring layer blocks being connected between said polyimide layers of said first wiring layer blocks through viaholes;

b) forming a second wiring layer block, by forming a layered structure of conductive wiring layers and polyimide layers on one of a ceramic board and a hard organic resin board, each of said polyimide layers of said second wiring layer block being formed between two successive layers of said conductive wiring layers of said second wiring layer block, and by forming metal bumps in electrical contact with said conductive wiring layers in said second wiring layer block on a top surface of said second wiring layer block, said conductive wiring layers of said second wiring layer block being connected between said polyimide layers of said second wiring layer block through viaholes;

c) interposing a first anisotropically conductive film, having conductive particles therein, between a bottom surface of one of said first wiring layer blocks and said top surface of said second wiring layer block;

d) superposing said bottom surface of said one of said first wiring layer blocks onto said top surface of said second wiring layer block with said first anisotropically conductive film therebetween, said metal bumps on said bottom surface of said one of said first wiring layer blocks being aligned with said metal bumps on said top surface of said second wiring layer block;

e) bonding and electrically connecting said one of said first wiring layer blocks and said second wiring layer block by subjecting said one of said first wiring layer blocks and said second wiring layer block to pressure and heat, said bonding being achieved by adhesive force of said first anisotropically conductive film under conditions of pressure and heating, said electrical connection being formed in regions where said metal bumps of said one of said first wiring layer blocks and said metal bumps of said second wiring layer block press against said first anisotropically conductive film, crushing said conductive particles in said first anisotropically conductive film only between said metal bumps;

f) interposing a second anisotropically conductive film, having conductive particles therein, between a bottom surface of another of said first wiring layer blocks and a top surface of said one of said first wiring layer blocks;

g) superposing said bottom surface of said another of said first wiring layer blocks onto said top surface of said one of said first wiring layer blocks with said second anisotropically conductive film therebetween, said metal bumps on said bottom surface of said another of said first wiring layer blocks being aligned with said metal bumps on said top surface of said one of said first wiring layer blocks;

h) bonding and electrically connecting said one of said first wiring layer blocks and said another of said first wiring layer blocks in a manner as recited in the step e;

i) repeating the steps f, g and h a number of times to form multiple wiring layer blocks stacked on said one of said ceramic and hard organic resin board; and j) forming electrode pads for connecting a large scale integrated (LSI) circuit on a top surface of an uppermost one of said plurality of first wiring layer blocks.

2. A method for manufacturing a polyimide multilayer wiring substrate as recited in claim 1, wherein the step of forming each of said first wiring layer blocks comprises the steps of:

a1) forming on said two sides of said one of said ceramic board and said hard organic resin board, a ground and connection wiring layer as part of said conductive wiring layers;

a2) applying a polyimide layer on said ground and connection wiring layer;

a3) forming said viaholes at predesignated positions in said polyimide layer;

a4) forming a signal wiring layer, as part of said conductive wiring layers, electrically connected to said ground and connection wiring layer through said viaholes; and a5) forming said metal bumps on said signal wiring layer, said metal bumps being in electrical contact with said signal wiring layer.

3. A method for manufacturing a polyimide multilayer wiring substrate as recited in claim 1, wherein the step of forming said second wiring layer block further comprises the steps of:

b1) forming on said one of said ceramic board and said hard organic resin board, a ground and connection wiring layer as part of said conductive wiring layers;

b2) applying a polyimide layer on said ground and connection wiring layer;

b3) forming said viaholes at predesignated positions in said polyimide layer;

b4) forming a signal wiring layer, as part of said conductive wiring layers, electrically connected to said ground and connection wiring layer through said viaholes; and b5) forming said metal bumps on said signal wiring layer, said metal bumps being in electrical contact with said signal wiring layer.

4. A method for manufacturing a polyimide multilayer wiring substrate as recited in claim 1, wherein said step of forming said layered structure of conductive wiring layers and polyimide layers on two surfaces of said one of said ceramic board or said hard organic resin board includes the step of forming layers alternately on said two surfaces of said one of said ceramic board and said hard organic resin board.

5. A method for manufacturing a polyimide multilayer wiring substrate comprising the steps of:

a) forming a plurality of first wiring layer blocks, each of said first wiring layer blocks being formed by forming a layered structure of conductive wiring layers and polyimide layers on top and bottom surfaces of one of a ceramic board and a hard organic resin board having an internal conductive layer, each of said polyimide layers of said first wiring layer blocks being formed between two successive layers of said conductive wiring layers of said first wiring layer blocks, and by forming metal bumps in electrical contact with said conductive wiring layers on a top surface of each of said first wiring layer blocks and forming a first plurality of viaholes in an outermost polyimide layer on a bottom surface of each of said wiring layer blocks, each of said first plurality of viaholes having a metal part at its bottom, said metal part being in electrical contact with said conductive wiring layers in the interior of said each of said first wiring layer blocks, said conductive wiring layers of said first wiring layer blocks being connected between said polyimide layers of said first wiring layer blocks through a second plurality of viaholes in said first wiring layer blocks;

b) forming a second wiring layer block, by forming a layered structure of conductive wiring layers and polyimide layers on one of a ceramic board and a hard organic resin board, each of said polyimide layers of said second wiring layer block being formed between two successive layers of said conductive wiring layers of said second wiring layer block, and forming a third plurality of viaholes in said polyimide layers through which said conductive wiring layers are electrically connected, and by forming metal bumps in electrical contact with said conductive wiring layers in said second wiring layer block on a top surface of said second wiring layer block, said conductive wiring layers of said second wiring layer block being connected between said polyimide layers of said second wiring layer block through a fourth plurality of viaholes in said second wiring layer block;

c) interposing a first anisotropically conductive film, having conductive particles therein, between a bottom surface of one of said first wiring layer blocks and said top surface of said second wiring layer block;

d) superposing said bottom surface of said one of said first wiring layer blocks onto said top surface of said second wiring layer block with said first anisotropically conductive film therebetween, said viaholes on said bottom surface of said one of said first wiring layer blocks being aligned with said metal bumps on said top surface of said second wiring layer block;

e) bonding and electrically connecting said one of said first wiring layer blocks and said second wiring layer block by subjecting said one of said first wiring layer blocks and said second wiring layer block to pressure and heat, said bonding being achieved by adhesive force of said first anisotropically conductive film under conditions of pressure and heating, said electrical connection being formed as said metal parts at said bottom of said viaholes of said one of said first wiring layer blocks and said metal bumps of said second wiring layer block press against said first anisotropically conductive film, crushing said conductive particles in said anisotropically conductive film only between said metal parts and said metal bumps;

f) interposing a second anisotropically conductive film, having conductive particles therein, between a bottom surface of another of said first wiring layer blocks and a top surface of said one of said first wiring layer blocks;

g) superposing said bottom surface of said another of said first wiring layer blocks onto said top surface of said one of said first wiring layer blocks with said second anisotropically conductive film therebetween, viaholes on said bottom surface of said another of said first wiring layer blocks being aligned with said metal bumps on said top surface of said one of said first wiring layer blocks;

h) bonding and electrically connecting said one of said first wiring layer blocks and said another of said first wiring layer blocks in a manner as recited in the step e;

i) repeating the steps f, g and h a number of times to form multiple wiring layer blocks stacked on said one of said ceramic and hard organic resin board; and j) forming electrode pads for connecting a large scale integrated (LSI) circuit on a top surface of an uppermost one of said plurality of first wiring layer blocks.

6. A method for manufacturing a polyimide multilayer wiring substrate as recited in claim 5, wherein said step of forming said layered structure of said first blocks formed by forming said layered structure of conductive wiring layers and polyimide layers on said top and bottom surfaces of said one of a ceramic board and a hard organic resin board includes the step of forming layers alternately on said top and bottom surfaces of said one of said ceramic board and said hard organic resin board.

7. A method for manufacturing a polyimide multilayer wiring substrate comprising the steps of:

a) forming a plurality of first wiring layer blocks, each of said first wiring layer blocks being formed by forming a layered structure of conductive wiring layers and polyimide layers on top and bottom surfaces of one of a ceramic board and a hard organic resin board having an internal conductive layer, each of said polyimide layers of said first wiring layer blocks being formed between two successive layers of said conductive wiring layers of said first wiring layer block, and by forming metal bumps in electrical contact with said conductive wiring layers on a bottom surface of each of said first wiring layer blocks and by forming a first plurality of viaholes in an outer polyimide layer on a top surface of each of said wiring layer blocks, each of said first plurality of viaholes having a metal part at its bottom, said metal part being in electrical contact with said conductive wiring layers in the interior of said each of said first wiring layer blocks, said conductive wiring layers of said first wiring layer blocks being connected between said polyimide layers of said first wiring layer blocks through a second plurality of viaholes in said first wiring layer blocks;

b) forming a second wiring layer block, by forming a layered structure of conductive wiring layers and polyimide layers on one of a ceramic board and a hard organic resin board, each of said polyimide layers of said second wiring layer block being formed between two successive layers of said conductive wiring layers of said second wiring layer block, forming viaholes in said polyimide layers through which said conductive wiring layers are electrically connected, and by forming additional viaholes in an outer polyimide layer on a top surface of said second wiring layer block, each of said additional viaholes having a metal part at its bottom, said metal part being in electrical contact with said conductive wiring layers in the interior of said second wiring layer block;

c) interposing a first anisotropically conductive film, having conductive particles therein, between said bottom surface of one of said first wiring layer blocks and said top surface of said second wiring layer block;

d) superposing said bottom surface of said one of said first wiring layer blocks onto said top surface of said second wiring layer block with said first anisotropically conductive film therebetween, said metal bumps on said bottom surface of said one of said first wiring layer blocks being aligned with said additional viaholes of said second wiring layer block;

e) bonding and electrically connecting said one of said first wiring layer blocks and said second wiring layer block by subjecting said one of said first wiring layer blocks and said second wiring layer block to pressure and heat, said bonding being achieved by adhesive force of said first anisotropically conductive film under conditions of pressure and heating, said electrical connection being formed as said metal bumps on said bottom surface of said one of said first wiring layer blocks and said metal parts at the bottom of said additional viaholes of said second wiring layer block press against said first anisotropically conductive film, crushing said conductive particles in said first anisotropically conductive film only between said metal parts and said metal bumps;

f) interposing a second anisotropically conductive film, having conductive particles therein, between a bottom surface of another of said first wiring layer blocks and a top surface of said one of said first wiring layer blocks;

g) superposing said bottom surface of said another of said first wiring layer blocks onto said top surface of said one of said first wiring layer blocks with said second anisotropically conductive film therebetween, metal bumps on a bottom surface of said another of said first wiring layer blocks being aligned with said viaholes on said top surface of said one of said first wiring layer blocks;

h) bonding and electrically connecting said one of said first wiring layer blocks and said another of said first wiring layer blocks in a manner as recited in the step e;

i) repeating the steps f, g and h a number of times to form multiple wiring layer blocks stacked on said one of said ceramic and hard organic resin board; and j) forming electrode pads for connecting a large scale integrated (LSI) circuit on a top surface of an uppermost one of said plurality of first wiring layer blocks.

8. A method for manufacturing a polyimide multilayer wiring substrate as recited in claim 7, wherein said step of forming said layered structure of said first blocks formed by forming said layered structure of conductive wiring layers and polyimide layers on said top and bottom surfaces of said one of a ceramic board or a hard organic resin board includes the step of forming layers alternately on said top and bottom surfaces of said one of said ceramic board or said hard organic resin board.

* * * * *